(12) United States Patent
Zhang et al.

(10) Patent No.: US 8,495,455 B1
(45) Date of Patent: Jul. 23, 2013

(54) SYSTEMS AND METHODS FOR PARALLEL DUAL-MODE TURBO DECODERS

(75) Inventors: Tao Zhang, San Diego, CA (US); Jianbin Zhu, Poway, CA (US); Yuan Li, San Diego, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 217 days.

(21) Appl. No.: 13/035,698

(22) Filed: Feb. 25, 2011

Related U.S. Application Data

(63) Continuation-in-part of application No. 13/006,359, filed on Jan. 13, 2011, and a continuation-in-part of application No. 12/986,138, filed on Jan. 6, 2011.

(51) Int. Cl.
*H03M 13/00* (2006.01)

(52) U.S. Cl.
USPC ........... 714/755; 714/752; 714/758; 714/759; 714/780

(58) Field of Classification Search
USPC .................... 714/755, 759, 780, 752, 758
See application file for complete search history.

(56) References Cited

U.S. PATENT DOCUMENTS

| 6,594,792 | B1 * | 7/2003 | Hladik et al. ............... 714/755 |
| 8,250,448 | B1 * | 8/2012 | Andrews ...................... 714/792 |
| 2007/0101231 | A1 * | 5/2007 | Kutz et al. .................... 714/755 |
| 2007/0234180 | A1 * | 10/2007 | Edmonston et al. ......... 714/759 |
| 2008/0092010 | A1 * | 4/2008 | Orio ............................. 714/755 |

\* cited by examiner

*Primary Examiner* — Sam Rizk
(74) *Attorney, Agent, or Firm* — Stamoulis & Weinblatt, LLC

(57) ABSTRACT

According to some embodiments, a turbo decoder configured for High-Speed Packet Access (HSPA) and Long Term Evolution (LTE) is provided, comprising: a plurality of maximum a posteriori (MAP) engines; a plurality of extrinsic memory banks accessible by a MAP engine of the plurality of MAP engines; and wherein when the turbo decoder is operating in HSDPA mode the plurality of extrinsic memory banks is configured such that during a first half of a decoding iteration, the MAP engine is able to read a first dataset from and write second dataset to the plurality of extrinsic memory banks in natural row and column order, and during a second half of the decoding iteration, the MAP engine is able to read a third dataset from and write a fourth dataset to the plurality of extrinsic memory banks in a predetermined row and column order in accordance with an interleaver table using a read column buffer and a write column buffer.

29 Claims, 13 Drawing Sheets

SYSTEMS AND METHODS FOR PARALLEL DUAL-MODE TURBO DECODERS

CROSS-REFERENCE TO RELATED APPLICATIONS

This application is a continuation-in-part and claims the benefit of U.S. application Ser. No. 13/006,359, filed Jan. 13, 2011, and U.S. application Ser. No. 12/986,138, filed Jan. 6, 2011, which are hereby incorporated herein in their respective entirety.

FIELD OF THE INVENTION

The present invention relates to radio communications, and more particularly, some embodiments relate to memory contention and turbo decoders for Universal Mobile Telecommunication Systems (UMTS) [e.g. High-Speed Packet Access (HSPA), which includes High-Speed Uplink and Download Packet Access] and 3rd Generation Partnership Project (3GPP) Long Term Evolution (LTE) Systems.

DESCRIPTION OF THE RELATED ART

Turbo decoders facilitate communication for a number of different radio communication technologies, including UMTS, LTE, Wideband Code Division Multiple Access (WCDMA), and High-Speed Packet Access (HSPA). In order to speed up data decoding, some traditional turbo decoders utilize two or more maximum a posteriori (MAP) engines to decode one code block at the same. However, due to random nature of interleavers utilized in traditional turbo decoders, the two or more MAP engines may access the extrinsic and systematic information memory banks at the same time, thereby resulting in memory contention and a slow down in decoding speed. FIGS. 1A and 1B illustrate two such situations.

FIG. 1A is a diagram illustrating extrinsic memory contention within a traditional turbo decoder comprising two MAP engines, while FIG. 1B is a diagram illustrating systematic memory contention within a traditional turbo decoder comprising two MAP engines. Specifically, FIG. 1A illustrates how, during a half-iteration (e.g., even or odd half-iteration) of the decoding process, Upper MAP engine 10 and Lower MAP engine 13, due to the operation of interleaver 16 and interleaver 19 respectively, write to lower extrinsic memory bank 25 simultaneously. This results in an extrinsic memory contention between Upper MAP engine 10 and Lower MAP engine 13. Similarly, FIG. 1B illustrates how, during an odd half-iteration of the decoding process, Upper MAP engine 11 and Lower MAP engine 14, due to the operation of interleaver 37 and interleaver 34 respectively, read from systematic memory bank 43 simultaneously. This results in a systematic memory contention.

FIG. 2 provides one approach by which some traditional turbo decoders avoid such extrinsic and systematic memory contention. The diagram of FIG. 2 illustrates the dataflow for the traditional turbo decoder 101 during even half-iteration 100, and during odd half-iteration 103. During even half-iteration 100, Upper MAP engine 109 receives input from systematic memory bank-1 (115), parity-1 memory bank-1 (118), and extrinsic memory bank a-1 (163), and outputs extrinsic information to extrinsic memory bank b-1 (127), or outputs a hard decision to output memory bank-1 (133). During even half-iteration 100, Lower MAP engine 112 receives input from systematic memory bank-2 (121), parity-1 memory bank-2 (124), and extrinsic memory bank a-2 (166), and outputs extrinsic information to extrinsic memory bank b-2 (130), or outputs a hard decision to output memory bank-2 (136).

During odd half-iteration 103, interleaver 154 receives data from systematic memory bank-1 (115) and parity-1 memory bank-2 (124) through first-in-first-out (FIFO) buffers 148, interleaves the data, and outputs the interleaved data into Upper MAP engine 109 and Lower MAP engine 112 as inputs. During odd half-iteration 103, interleaver 151 receives data from extrinsic memory bank b-1 (127) and extrinsic memory bank b-2 (130) through FIFO buffers 145, interleaves the data, and outputs the interleaved data into Upper MAP engine 109 and Lower MAP engine 112 as inputs. During odd half-iteration 103, Upper MAP engine 109 also receives parity-2 memory bank-1 (118) as an input, and Lower MAP engine 112 also receives parity-2 memory bank-2 (124).

As output, during odd half-iteration 103, Upper MAP engine 109 and Lower MAP engine 112 outputs into de-interleaver 157 that de-interleaves the data received, and outputs the de-interleaved data to extrinsic memory bank a-1 (163) and extrinsic memory bank a-2 (166) via FIFO buffers 180.

BRIEF SUMMARY OF EMBODIMENTS OF THE INVENTION

According to various embodiments of the invention, systems, methods, and apparatuses are provided for dual-mode turbo decoder, such as a HSPA/LTE turbo decoder. Specifically, some embodiments of the invention are configured to avoid extrinsic or systematic memory contention within a turbo decoder comprising multiple MAP engines. Some such embodiments accomplish this by configuring and utilizing memory banks within the turbo decoder in accordance with memory partition designs and interleaver designs of the present invention.

According to an embodiment of the invention, a turbo decoder is provided, comprising: a plurality of maximum a posteriori (MAP) engines; a plurality of extrinsic memory banks accessible by a MAP engine of the plurality of MAP engines; and wherein the plurality of extrinsic memory banks is configured such that during a first half of a decoding iteration, the MAP engine is able to read a first dataset from and write second dataset to the plurality of extrinsic memory banks in natural row and column order, and during a second half of the decoding iteration, the MAP engine is able to read a third dataset from and write a fourth dataset to the plurality of extrinsic memory banks in a predetermined row and column order in accordance with an interleaver table. For example, the first half of the decoding iteration may be the even half of the decoding iteration while the second half is the odd-half of the decoding iteration. The turbo decoder may further comprise an interleaver address generator that provides the predetermined row and column order as a plurality of memory addresses for the extrinsic memory banks.

According to another embodiment of the invention, a turbo decoder is provided, comprising: a plurality of maximum a posteriori (MAP) engines; a plurality of extrinsic memory banks accessible by a MAP engine of the plurality of MAP engines; and wherein the plurality of extrinsic memory banks is configured such that during a first half of a decoding iteration, the MAP engine is able to read a first dataset from and write second dataset to the plurality of extrinsic memory banks in intra-row order and natural column order, and during a second half of the decoding iteration, the MAP engine is able to read a third dataset from and write a fourth dataset to the plurality of extrinsic memory banks in a natural row and a predetermined column order in accordance with an interleaver table. Depending on the embodiment, the intra-row interleaving can be performed in either half iterations, while the inter-row interleaving (i.e., predetermined column order) is performed done during the odd half-interleave. Where intra-row natrual order is used in even half-iteration, some embodiments utilize the equation provided by the 3GPP WCDMA/HSPA specification.

In some embodiments, the turbo decoder further comprises a read column buffer, wherein during the second half of the decoding iteration, the third dataset is read from plurality of extrinsic memory banks in the predetermined row and column order and written to the read column buffer in natural order, and the MAP engines read the fourth dataset from the read column buffer in first-in-first-out order. In some such embodiments, the plurality of MAP engines comprises N MAP engines, and wherein each of the N MAP engines concurrently reads a subset of the third dataset from the read column buffer in parallel. In further such embodiments, the plurality of MAP engines comprises N MAP engines, wherein the plurality of extrinsic memory banks comprises R rows, and wherein the read column buffer size is at least R×N.

In other such embodiments, the plurality of MAP engines comprises N MAP engines, wherein the plurality of extrinsic memory banks comprises N memory banks, wherein collectively the N memory banks are divided into R rows such that each of the N memory banks contains R/N rows, wherein each column j of the read column buffer is associated with a corresponding jth MAP engine of the N MAP engines, and wherein reading the third dataset from plurality of extrinsic memory banks in the predetermined row and column order and writing the third dataset to the read column buffer in natural order comprises: for k=1, 2, 3, 4 . . . N and m=1, 2, 3, 4 . . . R/N, for each kth column of the read column buffer, reading a subset of the third dataset in parallel from a mth row of each of the N memory banks and writing the subset into a kth column of the read column buffer, wherein the subset is read from the mth row of each of the N memory banks according to the predetermined row and column order. For example, for k=1, 2, 3, 4 . . . N, concurrently each kth MAP engine of the N MAP engines may read a subset of the third dataset in parallel from a corresponding kth column of the read column buffer, after the read column buffer is full. Subsequently, another read column buffer may be loaded for data read from extrinsic memory bank.

In some embodiments, the turbo decoder further comprises a write column buffer, wherein during the second half of the decoding iteration, the MAP engines write the fourth dataset to the write column buffer in natural order, and the fourth dataset in the write column buffer is written to the plurality of extrinsic memory banks in the predetermined row and column. In some such embodiments, the plurality of MAP engines comprises N MAP engines, and wherein each of the N MAP engines concurrently writes a subset of the fourth dataset to the write column buffer in parallel. In further such embodiments, the plurality of MAP engines comprises N MAP engines, wherein the plurality of extrinsic memory banks comprises R rows, and wherein the write column buffer size is at least R×N.

In other such embodiments, the plurality of MAP engines comprises N MAP engines, wherein the plurality of extrinsic memory banks comprises N memory banks, wherein collectively the N memory banks are divided into R rows such that each of the N memory banks contains R/N rows, wherein each column j of the write column buffer is associated with a corresponding jth MAP engine of the N MAP engines, and wherein writing the fourth dataset to the write column buffer in natural order and writing the fourth dataset to the plurality of extrinsic memory banks in predetermined row and column order comprises: for k=1, 2, 3, 4 . . . N and m=1, 2, 3, 4 . . . R/N, for each kth column of the write column buffer, reading a subset of the fourth dataset from a kth column of the write column buffer and writing the subset in parallel to a mth row of each of the N memory banks, wherein the subset is written to the mth row of each of the N memory banks according to the predetermined row and column order. For example, for k=1, 2, 3, 4 . . . N, concurrently each kth MAP engine of the N MAP engines may write a subset of the fourth dataset in parallel to a corresponding kth column of the write column buffer after the write column buffer is full. Subsequently, another write column buffer may be utilized for loading.

In particular embodiments, the plurality of MAP engines comprises N MAP engines, wherein the plurality of extrinsic memory banks comprises N memory banks, wherein collectively the N memory banks are divided into R rows such that each of the N memory banks contains R/N rows, and wherein during the first half of the decoding iteration, for k=1, 2, 3, 4 . . . N, concurrently each kth MAP engine of the N MAP engines reads a subset of the first dataset in natural order from rows 1, 2, 3, 4 . . . R/N of a corresponding kth extrinsic memory bank of the N extrinsic memory banks. In various embodiments, the plurality of MAP engines comprises N MAP engines, wherein the plurality of extrinsic memory banks comprises N memory banks, wherein collectively the N memory banks are divided into R rows such that each of the N memory banks contains R/N rows, and wherein during the first half of the decoding iteration, for k=1, 2, 3, 4. N, concurrently each kth MAP engine of the N MAP engines writes a subset of the second dataset in natural order to rows 1, 2, 3, 4 . . . R/N of a corresponding kth extrinsic memory bank of the N extrinsic memory banks.

For some embodiments, the interleaver table is formatted in accordance with a 3rd Generation Partnership Project (3GPP) standard. For example, the 3rd Generation Partnership Project (3GPP) standard may include Wideband Code Division Multiple Access (WCDMA), High-Speed Packet Access (HSPA), Long Term Evolution (LTE). The interleave methods for WCDMA and HSPA are the same and nay utilize a read column buffer and a write column buffer mentioned in accordance with an embodiment. The interleave method for LTE is quadratic polynomial permutation (QPP), where the problem of memory contention does not exist so the column buffers are bypassed. For example, the extrinsic memory banks may collectively be divided into less than or equal to 20 rows, and less than or equal to 256 columns, in accordance with 3GPP standards.

In some embodiments, the plurality of extrinsic memory banks comprise dual-port memory banks. Additionally, in some embodiments, the plurality of MAP engines comprises a radix-2 MAP engine or radix-4 MAP engine (which performs the equivalent of two radix-2 operation cycles in one MAP cycle).

In further embodiments, in order to avoid systematic memory contention, the turbo decoder further comprises: a plurality of systematic memory banks; a plurality of parity memory banks; and wherein the turbo decoder is configured such that during decoding: in a first half of a decoding iteration, a MAP engine of the plurality of MAP engines: (i) receives as input systematic bits $s_i$ from a systematic memory bank of the systematic memory banks, a priori data $e_i$ from the first plurality of extrinsic memory banks, and parity-1 bits $p_i$ from a first parity memory bank of the plurality of parity memory banks, (ii) generates $v'_i = s_i + e'_i$, and (iii) stores $v'_i$ in the second plurality of extrinsic memory banks, where $e'_i$ is the extrinsic information generated by the MAP engine during the first half of the decoding iteration, and in a second half of a decoding iteration, the MAP engine: (iv) receives as input interleaved data $v_j$ from the second plurality of extrinsic memory banks, and parity-2 bits $p_j$ from a second parity memory bank of the plurality of parity memory banks, (v) generates extrinsic data $e'_j$, and (vi) stores $e'_j$ in the first plurality of extrinsic memory banks.

In particular embodiments, various operations described above are implemented as methods for turbo decoders, or methods that are implemented into other hardware, such as a computer system, which allows the hardware to perform operations in accordance with the operations described.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward systems, methods, and apparatuses relating to memory contention and dual-mode turbo decoders, such as a dual-HSPA/LTE turbo decoder.

Figure 1A:
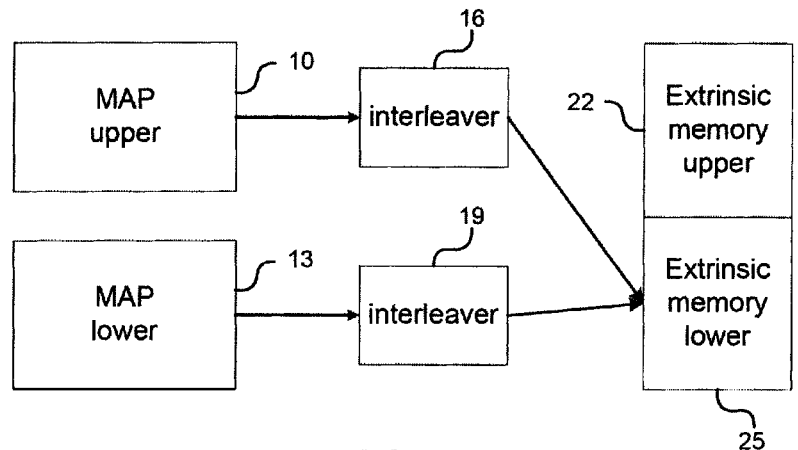
FIG. 1A is a diagram illustrating extrinsic memory contention within a turbo decoder.
Figure 1B:
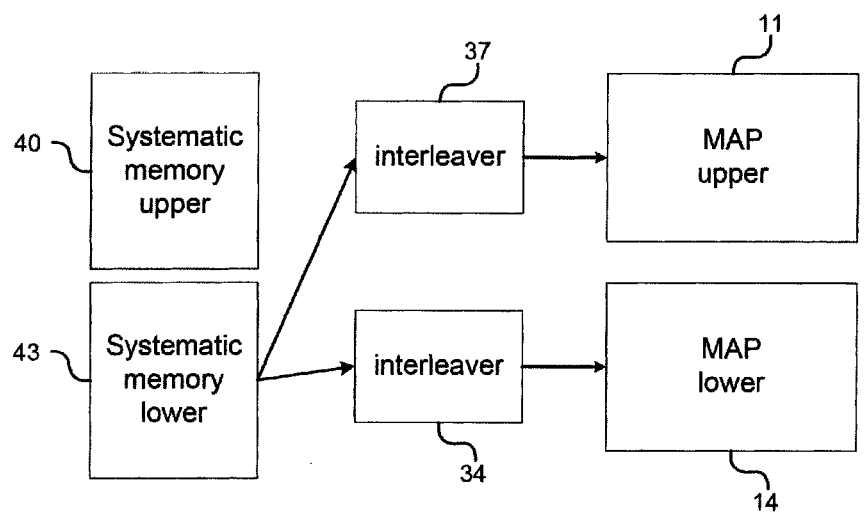
FIG. 1B is a diagram illustrating systematic memory contention within a turbo decoder.
Figure 2:
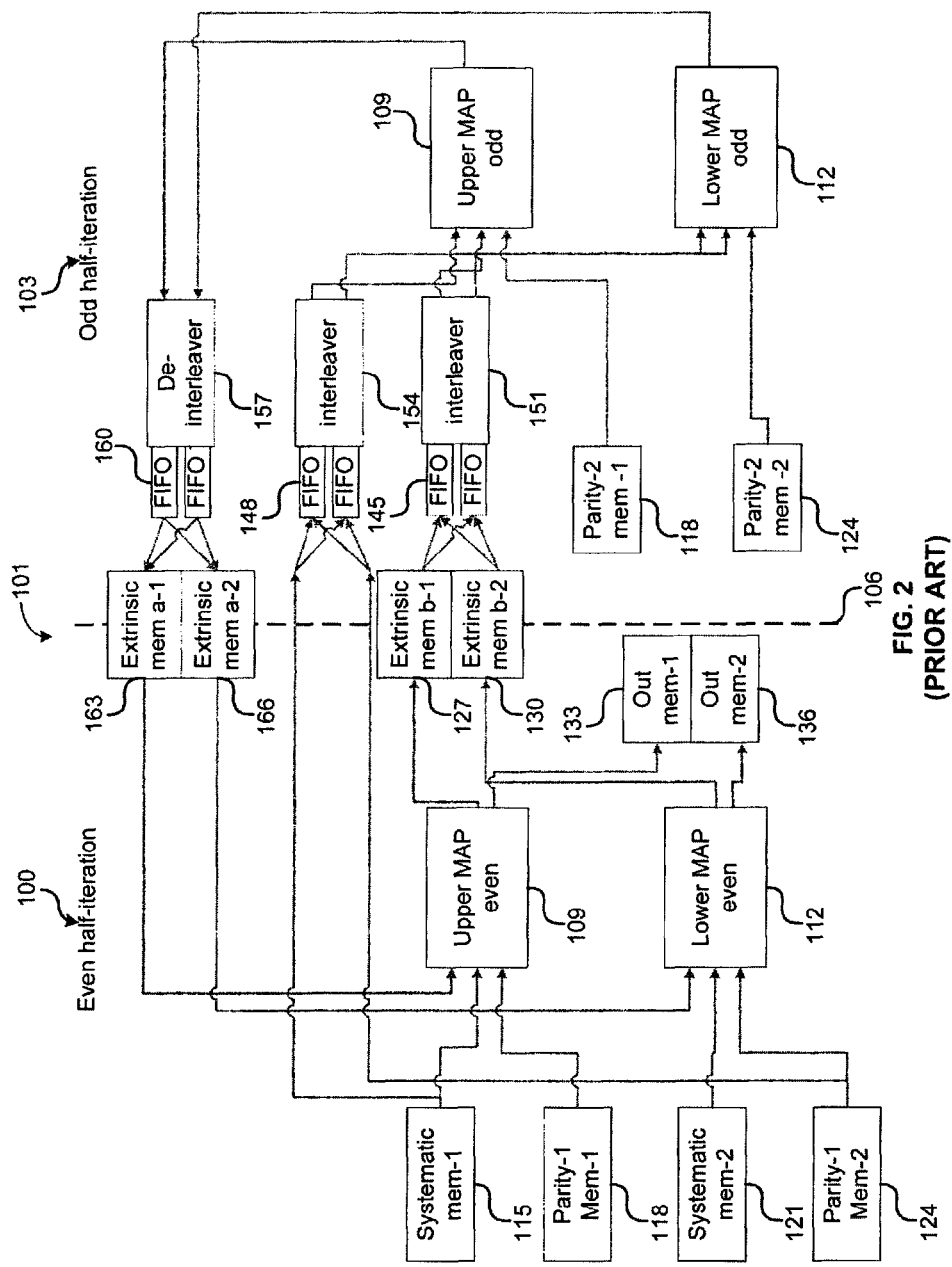
FIG. 2 is a diagram illustrating a traditional turbo decoder configured to avoid extrinsic and systematic memory contention.
Figure 3A:
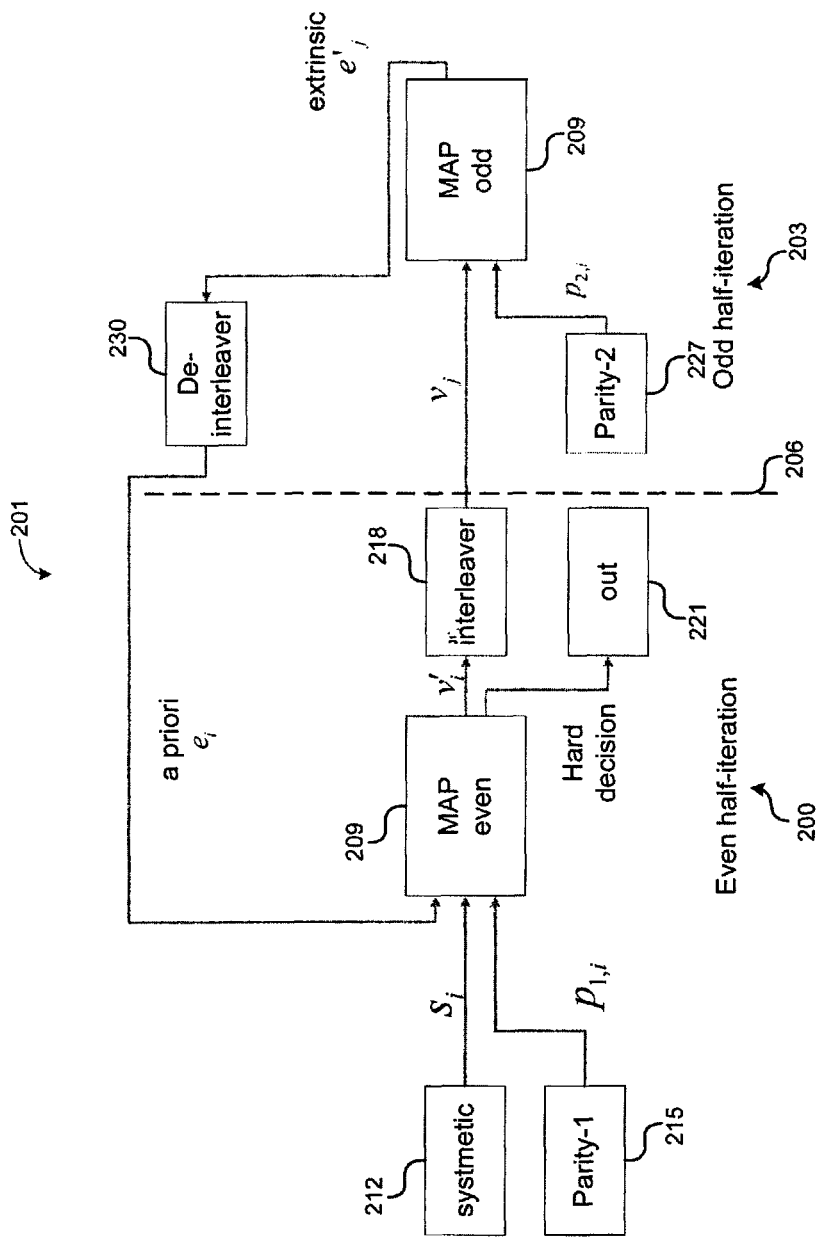
FIG. 3A is diagram illustrating an example turbo decoder according to one embodiment of the present invention that avoids systematic memory contention.

FIG. 3A is diagram illustrating an example turbo decoder 201, in accordance with one embodiment, that avoids systematic memory contention. As illustrated, during the even half-iteration 200, the turbo decoder algorithm takes in as input systematic bits $s_i$ from systematic memory bank 212, a priori information $e_i$ from de-interleaver 230, and parity-1 bits $p_{1,i}$ from parity-1 memory bank 215 as inputs. According to some embodiments, the de-interleaver 230 is a plurality of extrinsic memory banks that is organized and operates as a de-interleaver within the illustrated turbo decoder in accordance with the invention.

In the illustrated embodiment, MAP engine 209 then generates $v'_i = s_i + e'_i$ (rather than $e'_i$) as an output, which is subsequently stored in interleaver 218. Like the de-interleaver, according to some embodiments, the interleaver 218 is a plurality of extrinsic memory banks that is organized and operates as an interleaver within the illustrated turbo decoder in accordance with the invention. No interleaving is required for systematic bits and parity-1 bits. Additionally, in some embodiments, interleaver 218 and de-interleaver 230 may be implemented into the same plurality of extrinsic memory banks.

During the odd half-iteration 203, only $v_j = s_j + e_j$ from the last half-iteration taken as input and extrinsic information is generated as output $e'_j$. In the illustrated embodiment, this accomplished by MAP engine 209 receiving as input $v_j$ from interleaver 218 and parity-2 bits $p_{2,j}$ from parity-2 memory bank 227, and generating $e'_j$ as output. The output $e'_j$ is subsequently stored into de-interleaver 230 for use during the next even half-iteration of the decoding process.

By performing decoding according to FIG. 3A, some embodiments avoid accessing systematic bits during the odd half-iteration of the decoding process by having the MAP engine 209 output the sum of extrinsic bits and systematic bits in the even half-iteration. Additionally, by outputting the sum of extrinsic bits and systematic bits in the even half-iteration, such embodiments do not require systematic bits to be interleaved; effectively preventing a systematic memory contention from occurring and leaving only the extrinsic bits to be interleaved and de-interleaved during the decoding process.

Figure 3B:
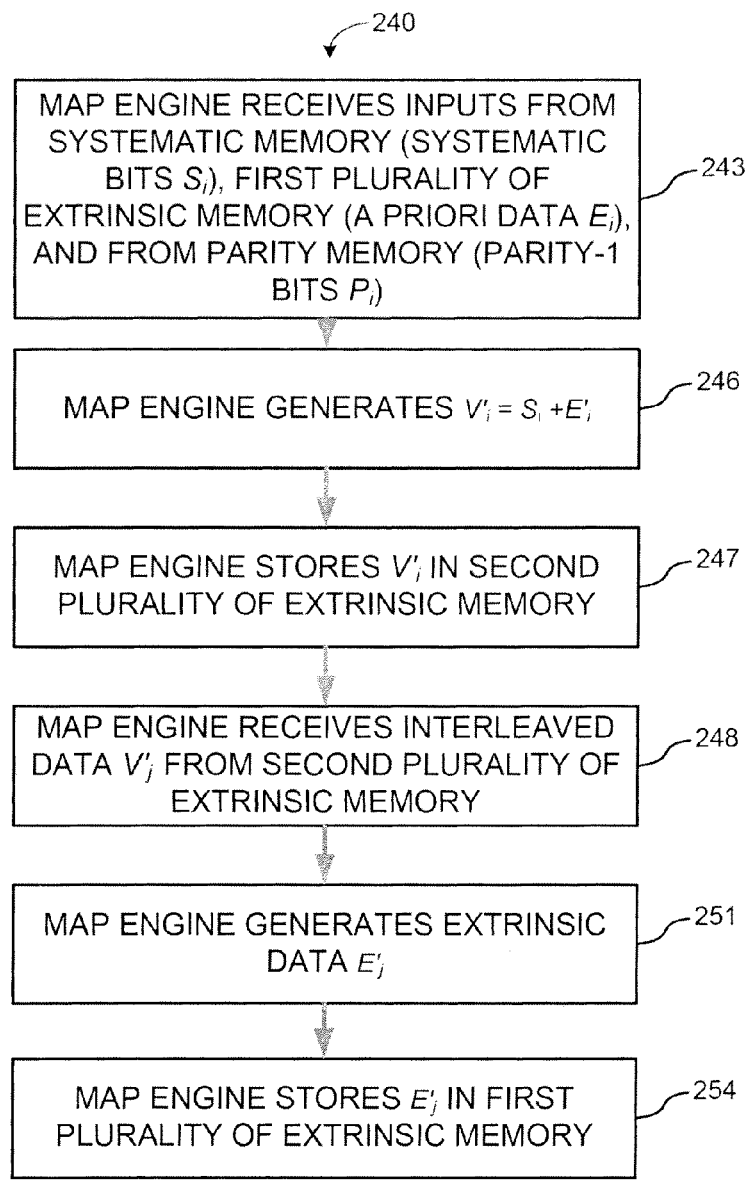
FIG. 3B is a flowchart illustrating an example method according to one embodiment of the present invention for avoiding systematic memory contention in a turbo decoder.

FIG. 3B is a flowchart illustrating an example method 240 in accordance with an embodiment for avoiding systematic memory contention in a turbo decoder, which may have multiple MAP engines. Method 240 begins with operations 243-247, which are performed during an even half-iteration of the decoding process. At operation 243, MAP engine receives as input systematic bits $s_i$ from a systematic memory bank of the systematic memory banks, a priori data $e_i$ from a first plurality of extrinsic memory banks, and parity-1 bits $p_i$ from a first parity memory bank of the plurality of parity memory banks. From these inputs, MAP engine generates $v'_1 = s_i + e'_i$, which is subsequently stored in a second plurality of extrinsic memory banks.

Method 240 then continues with operations 248-254, which are performed during an odd half-iteration of the decoding process. At operation 248, MAP engine receives as input interleaved data $v_j$ from the second plurality of extrinsic memory banks, and parity-2 bits $p_j$ from a second parity memory bank of the plurality of parity memory banks. From the input, the MAP engine generates extrinsic data $e'_j$, which is subsequently stored in the first plurality of extrinsic memory banks for use during the next even half-iteration of the decoding process.

In embodiments where the turbo decoder comprises two or more MAP engines, method 240 may be performed with respect to each MAP engine within the decoder in order to avoid systematic memory contention between the multiple MAP engines.

In accordance with embodiments of the invention, extrinsic memory contentions can be avoided by partitioning extrinsic memory banks, and organizing data within the extrinsic memory banks of a turbo decoder in the same format an interleaver (or de-interleaver) table. Effectively, in some embodiments, data within the extrinsic memory banks is stored and retrieved in a manner consistent with the format of a interleaver or de-interleaver table.

Figure 4:
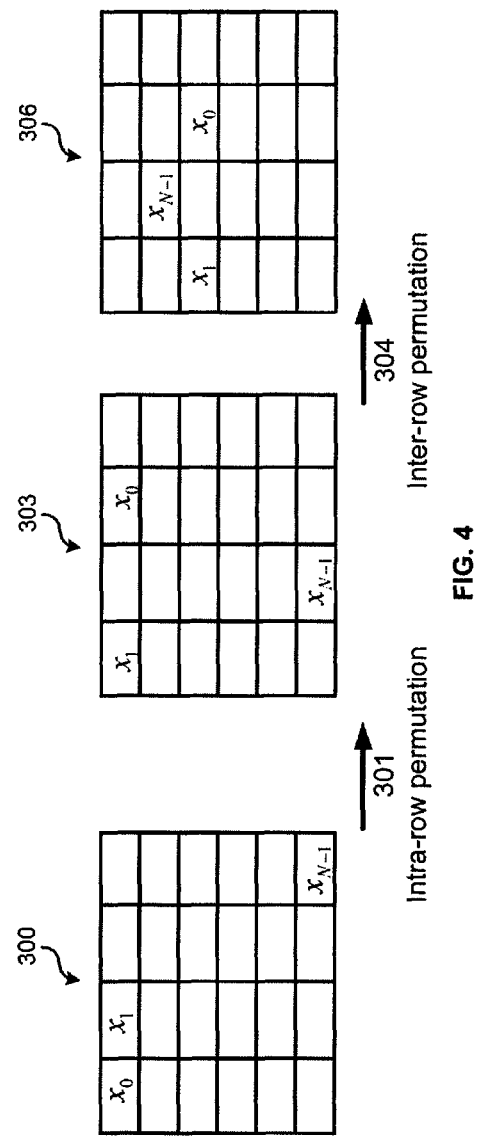
FIG. 4 is a diagram illustrating an example interleaving or de-interleaving of data in accordance with one embodiment of the present invention.

FIG. 4 is a diagram illustrating an example of how data within the extrinsic memory banks is interleaved (or de-interleaved) when the data is organized and accessed in accordance with one embodiment of the present invention. Specifically, in some embodiments, when data within extrinsic memory banks is accessed (i.e., read from or written to extrinsic memory banks), it is interleaved according to the interleaving in FIG. 4. In additional embodiments, the interleaving (and, conversely, the de-interleaving) of data to and from the extrinsic memory is performed according to 3GPP Turbo interleaver specifications (e.g., WCDMA/HSPA interleaver table). The 3GPP specification is a well known standard to those of ordinary skill in the art.

The interleaving (or de-interleaving) of FIG. 4 is performed as two operations. In the first operation 301, the data of table 300 is intra-row permuted such that table 303 results (in other words, the columns of table 300 are permuted). In the second operation 304, the data of table 303 is inter-row permuted such that table 306 results (in other words, the rows of table 303 are permuted). In some embodiments, the intra-row permutation operation and inter-row permutation operation are exchangeable. For example, in some embodiments, the intra-row permutation may be performed during an even half-iteration while the inter-row permutation may be performed during an odd half-iteration. Conversely, in some embodiments, the intra-row permutation may be performed during an odd half-iteration while the inter-row permutation may be performed during an even half-iteration.

By using performing interleaving of data to and from the extrinsic memory in accordance with a WCDMA/HSPA permutation matrix, such as illustrated in FIG. 4, some embodiments of the present invention can divide the extrinsic memory into N physical memory banks to allow N MAP engines to access the physical memory banks in parallel during a first half of a decoding iteration (e.g., even-half of a decoding iteration. Depending on the embodiment, the data content of the extrinsic memory during the first half of the decoding iteration may be in natural order (e.g., left-to-right within a row, starting with the top most row and working downward) or intra-row order.

Then, during the second half of a decoding iteration (e.g., odd-half of a decoding iteration), some embodiments utilize a read column buffer to read interleaved data from the N extrinsic memory banks for the N MAP engines, and a write column buffer to write interleaved data to the N extrinsic memory banks for the N MAP engines. By utilizing the read column buffer and the write column buffer, the N MAP engines can simultaneously access interleaved data from the N extrinsic memory banks while avoiding memory contention issues. For example, during an odd half-iteration, all the N MAP engines may simultaneously access interleaved data from the first of the N extrinsic memory banks, thereby causing a memory contention issue between the N MAP engines. Such an issue may arise when each N MAP engine simultaneously tries to access interleaved data from different memory locations within that the same memory bank. In order to avoid this memory contention issue, some embodiments utilize a column read buffer configured to successively pre-load the extrinsic data from the N extrinsic memory banks on behalf of each of the N MAP engines, before the N MAP engines attempt to access the N extrinsic memory banks. Once the pre-loading has completed, the N MAP engines can concurrently access their respective extrinsic data in parallel from the column read buffer for processing.

In some embodiments, in order for the pre-loading to be achieved, the depth of the read or write column buffer is at least equal to the number of rows the N extrinsic memory banks, and the linear size of the read or write column buffer is at least equal to the number of N MAP engines (i.e., a column for each MAP engine). Accordingly, in some embodiments, the read or write column buffer utilized could be of size R rows and N columns (i.e., R×N). For example, in embodiments where the extrinsic memory conforms to 3GPP standards and the number of rows for the N memory banks is 20 (the max allowed under 3GPP standards), the depth of the read column buffer is 20. In another example, where there are 4 MAP engines, the linear size of the read column buffer is 4. In yet another example, where the turbo decoder comprises N MAP radix-4 engines, ping-pong buffers, N extrinsic memory banks divided into R rows, and a read column buffer and a write column buffers combined into one, the total column buffer size is R*N*2(ping-pong buffers)*2(a read and a write buffer).

A ping-pong buffer may be utilized so that while a MAP engine is processing one column of data from a read column buffer, the next column of data can be pre-fetched. For example, such a situation may arise where an embodiment that utilizes radix-4 MAP engines and uses the radix-4 MAP engines as a radix-2 MAP engines during the odd half-iteration, thereby using only half of the data read out to the read column buffer.

Figure 5:
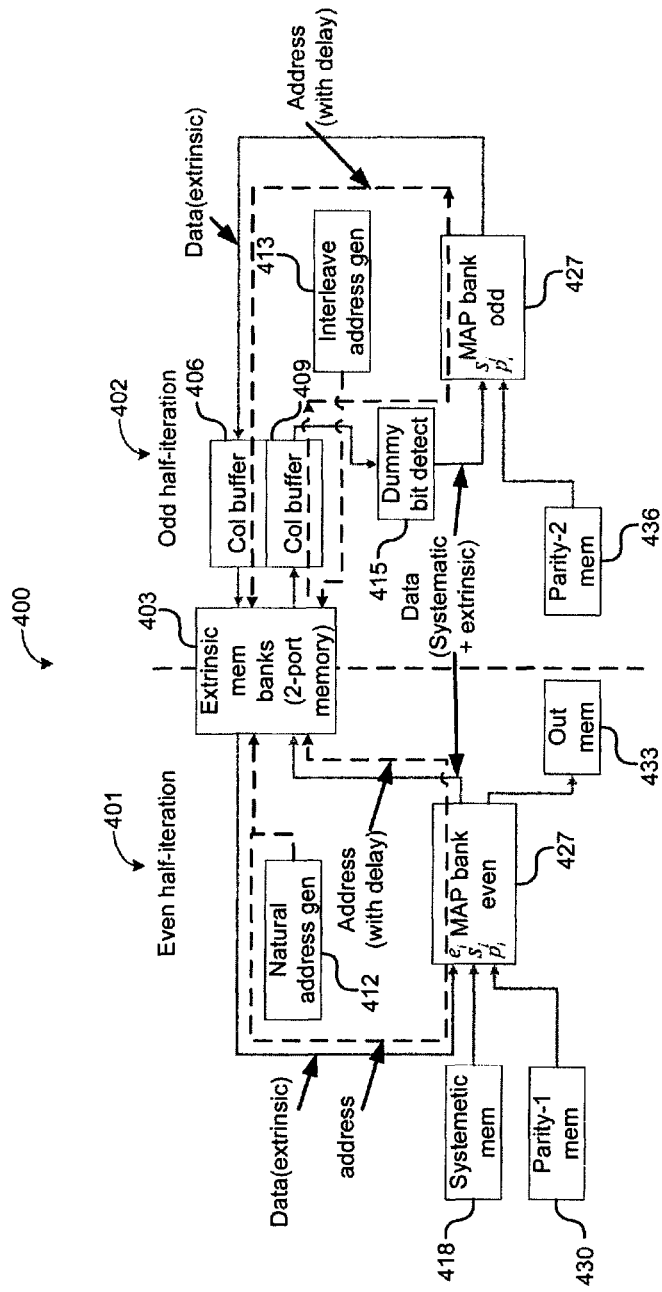
FIG. 5 is a diagram illustrating an example turbo decoder during an even half-iteration operation and an odd half-iteration operation in accordance with one embodiment of the present invention.

FIG. 5 is a diagram illustrating an example turbo decoder 400 during an even half-iteration operation 401 and an odd half-iteration operation 402 in accordance with one embodiment of the present invention. Turbo decoder 400 comprises extrinsic memory banks 403, natural memory address generator 412, interleave memory address generator 413, MAP engine bank 427, systemic memory bank 418, parity-1 memory bank 430, parity-2 memory bank 436, output memory bank 433, write column buffer 406, read column buffer 409, and dummy bit detection 415. MAP engine bank 427 comprises two or more MAP engines, each of which has an extrinsic information input ($e_i$), a systematic information input ($s_i$), and a parity information input ($p_i$). With respect to outputs, MAP engines have an output for a hard decision and an output for soft data.

Depending on the embodiment, MAP engine bank 427 may comprise radix-2 MAP engines or radix-4 MAP engines. In embodiments where radix-4 MAP engines are utilized, in order to avoid building a MAP engine that is switchable between radix-4 mode and radix-2 mode, a radix-4 MAP engine may be used as a radix-2 MAP engine in odd half-iterations 402 by performing MAP operations at every other cycle (e.g., by halting the radix-4 MAP engine at every other cycle) while still continuing to read input information from the input memory at every cycle. Then, at cycles where the radix-4 MAP engine is active, it receives two input bits as opposed to one, effectively halving its performance output to a radix-2 MAP engine.

During the even half-iteration 401, MAP engine bank 427 generates $v'_i = s_i + e'_i$ (i.e., systematic+extrinsic information bits) as output by reading systematic bits ($s_i$) from systematic memory bank 418, parity-1 bits ($p_i$) from parity-1 memory bank 430, and extrinsic bits (e) from extrinsic memory banks 403. As noted herein, by outputting the sum of extrinsic bits and systematic bits in the even half-iteration, embodiments can avoid access of systematic bits during the odd half-iteration, avoid the need to interleave the systematic bits, and prevent a systematic memory contention. In the illustrated embodiment, the extrinsic bits ($e_i$) are read from extrinsic memory banks 403 in natural row and column order based on the address passed to extrinsic memory banks 403 by natural memory address generator 412, and subsequently the output $v'_i = s_i + e'_i$ of MAP engine bank 427 is written back to same location from where the extrinsic bits ($e_1$) were read. Also as illustrated, to avoid having two natural memory address generators for both read and write during an even half-iteration 401, while natural memory address generator 412 is utilized during the read operation of the extrinsic bits ($e_i$), the read memory address is also passed to MAP engine bank 427, which outputs a delayed version of the read memory address that is used in a subsequent write operation of $v'_i = s_i + e'_i$ to extrinsic memory banks 403. More with respect to the even half-iteration is discussed herein with reference to FIG. 9, which illustrates an example extrinsic data flow during an even half-iteration operation for a turbo decoder according to one embodiment of the present invention.

Subsequently, during the odd half-iteration 402. MAP engine bank 427 generates $e'_i$ (i.e., extrinsic information bits) as output by reading in systematic and extrinsic bits $v_i = s_i + e_i$ from extrinsic memory banks 403, and parity-2 bits ($p_2$) from parity-2 memory bank 436. The systematic and extrinsic bits $v_i = s_i + e_i$ are read from extrinsic memory banks 403 in an interleaved order based on the address passed to extrinsic memory banks 403 by interleave memory address generator 413. Subsequently, the output $e'_i$ of MAP engine bank 427 is written back to same location from where systematic and extrinsic bits $v_i = s_i + e_i$ were read. Similar to the even half-iteration, to avoid having two interleave memory address generators for both read and write during an odd half-iteration 402, interleave memory address generator 413 is utilized during the read operation of systematic and extrinsic bits $v_i = s_i + e_i$, the read address is inputted to MAP engine bank 427, and a delayed version of the read address passes through MAP engine bank 427 and is outputted for the subsequent write operation of $e'_i$ to extrinsic memory banks 403. Depending on the embodiment, the amount of the delay in the read address passing through MAP engine bank 427 is associated with the delay of the MAP engine's processing. More with respect to the odd half-iteration is discussed herein with reference to FIG. 7, which illustrates an example extrinsic data flow during an odd half-iteration operation for a turbo decoder according to one embodiment of the present invention.

Unlike the even half-iteration, during the odd half-iteration, MAP engine hunk 427 utilizes a read column buffer 409 and a write column buffer 406 to access extrinsic memory banks 403. In doing so, extrinsic memory contentions can be avoided while the MAP engine bank can still access information bits from extrinsic memory banks 403 in parallel. As previously noted herein, when all the MAP engines within MAP engine bank 427 simultaneously access interleaved data from the same extrinsic memory bank, this results in an extrinsic memory contention issue between the MAP engines. Accordingly, to avoid this extrinsic memory contention issue during an odd half-iteration read operation, some embodiments utilize a column read buffer configured to successively pre-load the extrinsic data from the N extrinsic memory banks on behalf of each of the N MAP engines, after which the N MAP engines can concurrently access their respective extrinsic data in parallel from the column read buffer. Likewise, to avoid this extrinsic memory contention issue during an odd half-iteration write operation, some embodiments utilize a column write buffer configured to concurrently receive $e'_i$ output from the N MAP engines in parallel, and then the $e'_i$ bits are written to extrinsic memory banks 403 successively on behalf of each of the N MAP engines.

Turbo decoder 400 also has dummy bit detection module 415, which is configured to detect dummy bits within extrinsic memory banks 403 before they are inputted into MAP bank 427. According to the 3GPP specification, a interleaver permutation matrix has R*C elements, while the input data have K bits. For example, in extrinsic memory banks 403 may have 20 rows and 256 columns, the maximum allowed in accordance with the 3GPP WCDMA/HSPA specification. In some embodiments, when R*C>K, the rest of the matrix is occupied by dummy bits, which will be pruned during memory access and interleave processing. In some embodiments, the positions of those dummy bits all the dummy bits are located in the last three rows of extrinsic memory banks 403, and are marked as dummy bits while the input soft bits are being written into systematic and parities memory. In order to avoid extra memory storage for dummy bits, the dummy bits may be marked as the most negative value recognized by the embodiment, while the normal output data from the MAP engines is in two's complement and range symmetrically. It should be noted that at the first even half iteration, the output of the MAP engines may overwrite some of the "most negative values," leaving the remaining "most negative values" as real dummy bits.

Subsequently, in each odd half-iteration, when the dummy bits are read out from extrinsic memories, dummy bit detection module 415 detects the dummy bit by comparing the value with the most negative value. If the value is the same as the most negative value, a data invalid signal will be sent to MAP engine bank 427 to hold MAP engines within hank 427 for a cycle, thereby allowing the interleave memory address generator an extra clock cycle to jump over the dummy bits.

Once a MAP engine is halted for a cycle, it resumes receipt of the next extrinsic bits. Even half-iterations do not require a dummy bit detection module as the MAP engines process input in sequence and there are not dummy bits encountered until the end of an iteration.

Depending on the embodiment, the MAP engines may or may not be held for a cycle simultaneously. However, in some embodiments, the decoding bits within extrinsic memory banks 403 are aligned at each column boundary so that the dummy bit positions in a column cause a corresponding MAP engine to pause for the current cycle but all the MAP engines will be able to process the data inside the same row of extrinsic memory banks 403.

Figure 6:
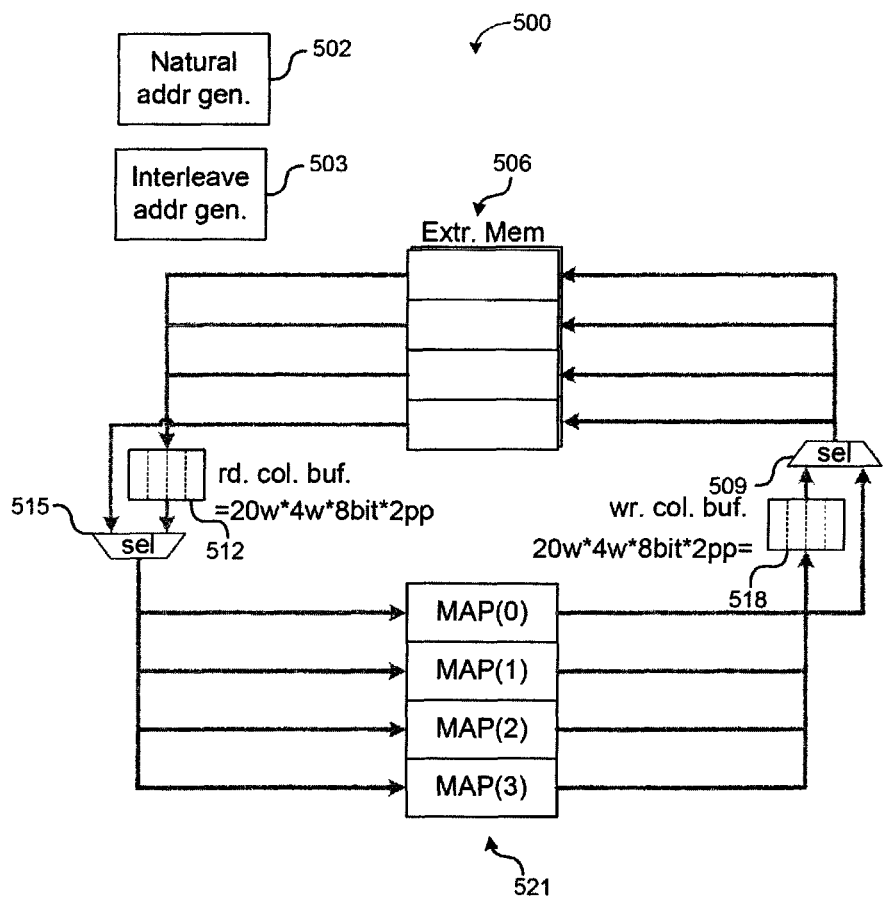
FIG. 6 is a diagram illustrating an example extrinsic data flow for a turbo decoder according to one embodiment of the present invention.

FIG. 6 is a diagram illustrating an example extrinsic data flow 500 for a turbo decoder according to one embodiment of the present invention. The turbo decoder illustrated comprises a natural memory address generator 502, an interleave memory address generator 503, extrinsic memory banks 506, MAP engine bank 521 comprising of four MAP engines, read column buffer 512, read selector 515, write column buffer 518, and write selector 518. Depending on the embodiment, the MAP engines may be radix-2 or radix-4 MAP engines. In the illustrated embodiments, four radix-4 MAP engines are illustrated, which are used as radix-4 MAP engines during the even half-iteration and used as radix-2 MAP engines during the odd half-iteration. In alternative embodiments, the turbo decoder may comprise four radix-4 MAP engines that are utilized during the even half-iteration, and four radix-2 MAP engines that are utilized during the odd half-iteration. It should be noted that when the illustrated embodiment is being used in HSPA mode, the selectors 515 and 509 are configured such that read column buffer 512 and write column buffer 518 are utilized in at least one half-iteration of the decoding process. When the illustrated embodiment is being used in LTE mode, the selectors 515 and 509 are configured to bypass read column buffer 512 and write column buffer 518 respectively.

Additionally, depending on the embodiment extrinsic memory banks 506 may comprise the same number of memory banks as the number of MAP engines present in MAP engine bank 521. For example, where there are four radix-2 MAP engines present in MAP engine bank 521, extrinsic memory banks 506 is divided into four extrinsic memory banks. Extrinsic memory banks 506 are collectively divided further into rows in accordance with the interleaver method utilized by the turbo decoder. For example, under the 3GPP WCDMA/HSPA standard, extrinsic memory banks 506 may be divided into 20 rows, wherein each extrinsic memory bank comprises 5 rows Further, in some embodiments, the total size (number of columns and rows) of extrinsic memory may be set according to the interleaves permutation matrix.

In some embodiments, the turbo decoder may comprise eight radix-2 MAP engines working at both even and odd half-iterations. To support the eight radix-2 MAP engines, in some embodiments, the extrinsic memory banks 506 would divided row-wisely into eight extrinsic memory banks. Where extrinsic memory banks is divided into 20 rows in accordance with the 3GPP standard, the rows can be distributed amongst the eight extrinsic memory banks in a number of different arrangements, including as follows: {3 rows, 2 rows, 3 rows, 2 rows, 3 rows, 2 rows, 3 rows, 2 rows}, or {3 rows, 3 rows, 3 rows, 3 rows, 3 rows, 3 rows, 2 rows, 0 rows}.

As discussed herein, during odd half-iteration of a decoding process, read column buffer 512 is configured to pre-load interleaved extrinsic bits from extrinsic memory banks 506 and then feed the extrinsic bits to the MAP engines of MAP engine bank 521 in parallel, while write column buffer 518 is configured to receive output bits from the MAP engines of MAP engine bank 521 in parallel and then successively write those output bits to extrinsic memory banks 506 in interleaved order (i.e., off-load those bits). In the illustrated embodiment, size of the read column buffer and the write column buffer is 20×4×8 bits×2 (2560 bits), as extrinsic memory banks is collectively divided into 20 rows (the maximum allowed under the 3GPP standard), there are 4 extrinsic memory banks (for four MAP engines), the extrinsic information size is 8 bits, and each buffer is a ping-pong buffer (each equating to two buffers). During the odd half-iteration, read selector 515 is configured to feed data to MAP engine bank 521 from read column buffer 512, and write selector 509 is configured to write data from write column buffer 518. Additionally, during the odd half-iteration, interleave memory address generator 503 is utilized to read interleaved data from extrinsic memory banks 506 and write interleaved data to extrinsic memory banks 506.

Figure 7:
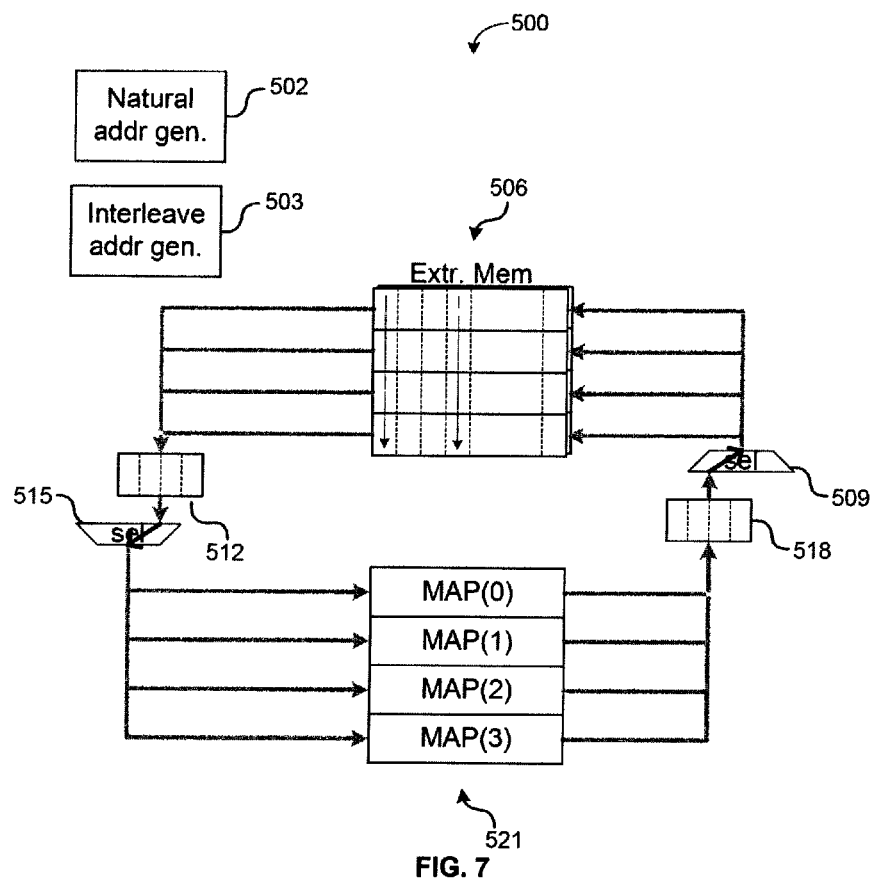
FIG. 7 is a diagram illustrating an example extrinsic data flow during an odd half-iteration operation for a turbo decoder according to one embodiment of the present invention.

FIG. 7 illustrates extrinsic data flow 500 during the odd half-iteration operation of the illustrated turbo decoder. As illustrated, read column buffer 512 is selected to feed data to MAP engine bank 521, and write column buffer 509 is selected to feed data to extrinsic memory banks 506. The extrinsic bits to be processed by MAP engine bank 521 is divided column-wisely in extrinsic memory banks 506 according to an interleave table. Because the data in each row of extrinsic memory banks 506 is in natural order, during the odd half-iteration, inter-row interleaving and intra-row interleaving are performed on the data as it is pre-loaded into read column buffer 512 from extrinsic memory banks 506. In alternative embodiments, the data in each row of extrinsic memory banks 506 may be stored in intra-row interleaved natural order (where the intra-row interleaving is performed during the even half-iteration), leaving only the inter-row interleaving to be performed on the data during the odd half-iteration as it is pre-loaded into read column buffer 512 from extrinsic memory banks 506. Depending on the embodiment, MAP engine bank 521 reads the data from read column buffer 512 in first-in-first-out order. Additionally, depending on the embodiment, each MAP engine within MAP engine bank 521 may read data from a particular column within the read column buffer that is assigned to them. Conversely, when MAP engine bank 521 outputs extrinsic bits, it writes it to write column buffer 509, from where the output extrinsic bits are read from write column buffer 509 in first-in-first-out order and written to extrinsic memory banks 506. Depending on the embodiment, the output extrinsic bits read from write column buffer 509 are read one column at a time, where each column is assigned to a specific MAP engine within the MAP engine bank 521.

Figure 8:
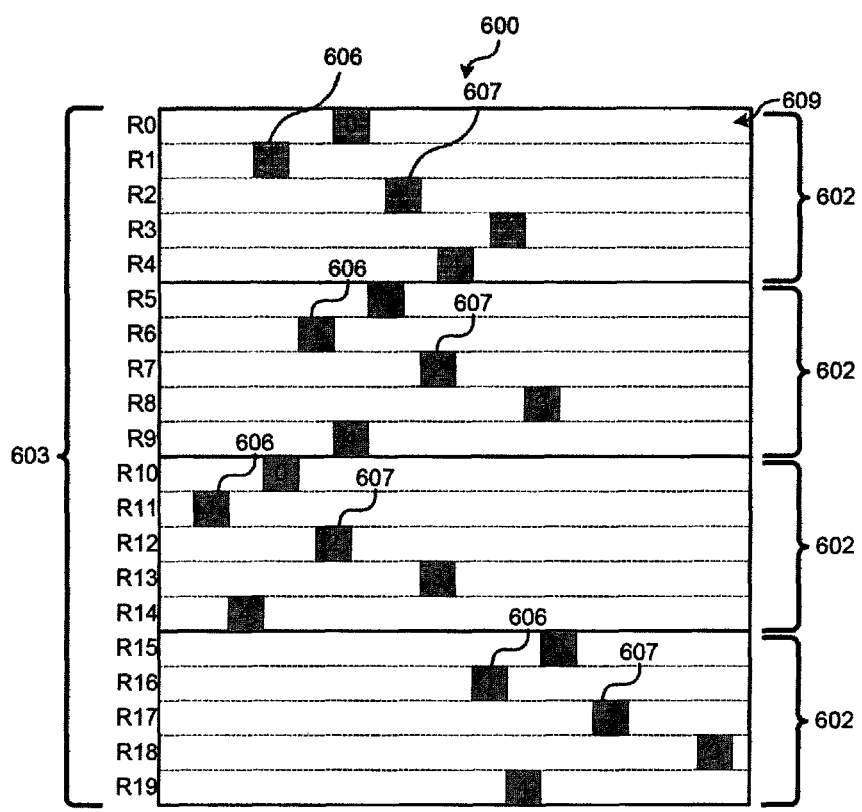
FIG. 8 is a diagram illustrating an example of how data is read from or written data to extrinsic memory banks in a predetermined row and column order in accordance with one embodiment of the present invention.

FIG. 8 is a diagram illustrating an example of how data is read from or written data to extrinsic memory banks in a predetermined row and column order in accordance with one embodiment of the present invention. Specifically, FIG. 8 illustrates how data is read from or written to extrinsic memory banks in accordance with an interleaver table (i.e., in inter-row interleaved and intra-row interleaved order) during an odd half-iteration. Turning now to FIG. 8, extrinsic memory banks 600 comprises of four 2-port (i.e., 1 read port/1 write port) extrinsic memory banks 602 collectively divided (603) into 20 rows (609) such that each extrinsic memory bank 602 comprises 5 rows. As previously noted herein, during odd half-iteration of a decoding process, a read column buffer is configured to pre-load interleaved extrinsic bits from extrinsic memory banks and feed the extrinsic bits to a bank of MAP engines (i.e., MAP engine bank) in parallel.

In the illustrated embodiment, during an odd half-iteration, for each MAP engine within the MAP engine bank, extrinsic bits relevant to the current MAP engine are read from all 20 rows of extrinsic memory banks 600 and stored to a read column buffer before the current MAP engine receives the data from the read column buffer. Similarly, during the odd half-iteration, each MAP engine in parallel writes extrinsic bits to a their assigned column within a write column buffer, and the extrinsic bits in each column of the write column buffer are distributed and written to the 20 rows of extrinsic memory banks 600. Because at any given moment each extrinsic memory bank 602 can only read from or write to a single memory location within a given extrinsic memory bank 602, in order to access (read or write) all 20 rows of extrinsic memory banks 600 for a given MAP engine (when pre-loading a read column buffer or off-loading a write column buffer), the each memory bank is accessed in parallel such that each row of each memory bank is accessed successively (i.e., for a given MAP cycle, one row of each of the four extrinsic memory banks 602 is accessed in parallel). For example, during the $2^{nd}$ cycle of accessing extrinsic memory banks 600, every bit 606 located on the $2^{nd}$ row of each extrinsic memory bank 602 is accessed in parallel (note, the number in the block indicates the cycle in which the bit is accessed); in the $3^{rd}$ cycle, every bit 607 located on the $3^{rd}$ row of each extrinsic memory bank 602 is accessed in parallel. In the immediate embodiments, because there are 20 rows in extrinsic memory banks 600, 5 MAP cycles is required to access extrinsic bits from all 20 rows on behalf of each MAP engine. In some embodiments, this process is repeated for each MAP engine within the MAP engine bank. Hence, if there are four MAP engines within the MAP engine bank, it would take a total of 20 MAP cycles to pre-load extrinsic bits to a read column buffer at the beginning of an odd half-iteration, and 20 MAP cycles to off-load extrinsic bits from a write column buffer at the end of an odd half-iteration.

The memory location of the relevant extrinsic bit on each row is determined by an interleave memory address generator (i.e., 503), which generates memory addresses according to an interleaver permutation matrix (e.g. inter-row interleave order, intra-row interleave order, or both). When reading inputs from extrinsic buffer, there is possibility that the input for different MAP engines are stored in the same memory location within the extrinsic memory banks. Accordingly, in some embodiments, the reading logic used to pre-load the read column buffer or the writing log used to off-load the write column buffer is configured to be aware of such situation and properly distribute the inputs to different MAP engines. Depending on the embodiment, the column buffers (e.g., 512, 518) can be implemented as regular memories or registers. In embodiments where the read and write column buffers are implemented as registers, the N MAP engines can access them simultaneously. In embodiments where the read and write column buffers are implemented as memories, a smaller pre-load buffer may be required for each column buffer; the smaller pre-load buffers would be implemented as registers.

In embodiments where N radix-4 MAP engines (e.g., 4 radix-4 MAP engines), extrinsic memories can be divided into 2N banks to support the four radix-4 MAP engines. Of the 2N banks of extrinsic memory, N banks can be used to store even extrinsic bits and N banks can be used to store odd extrinsic bits in accordance with an interleaver permutation matrix. The extrinsic value is stored such that the even bits are in one bank and the odd bits are in the other hank (where the even/odd is referenced before intra-row interleaving). Through this division, during the even half-iteration the turbo decoder will be able to read one extrinsic bit from the even bank and the other extrinsic bit from odd bank per a clock cycle of each radix-4 MAP engine. During the odd half-iteration, for embodiments that utilize radix-4 MAP engines as radix-2 MAP engines, only four extrinsic values need to be read or written for four radix-2 MAP and these four extrinsic bits reside in different memory banks.

Turning back to FIG. 6, during the even half-iteration, extrinsic bits are read from extrinsic memory banks 506 in natural row and column order (e.g., left-to-right within a row, starting with the top most row and working downward). Accordingly, during the even half-iteration, read selector 515 is configured to feed data to MAP engine bank 521 directly from extrinsic memory banks 506 and bypass read column buffer 512, and write selector 509 is configured to write data from MAP engine bank 521 and bypass write column buffer 509. Additionally, during the odd half-iteration, natural memory address generator 502 is utilized to read data from extrinsic memory banks 506 in natural row and column order. Depending on the embodiment, the natural row order could be left-to-right or right-to-left, and the natural column order may be from top row to bottom row or bottom row to top row.

Figure 9:
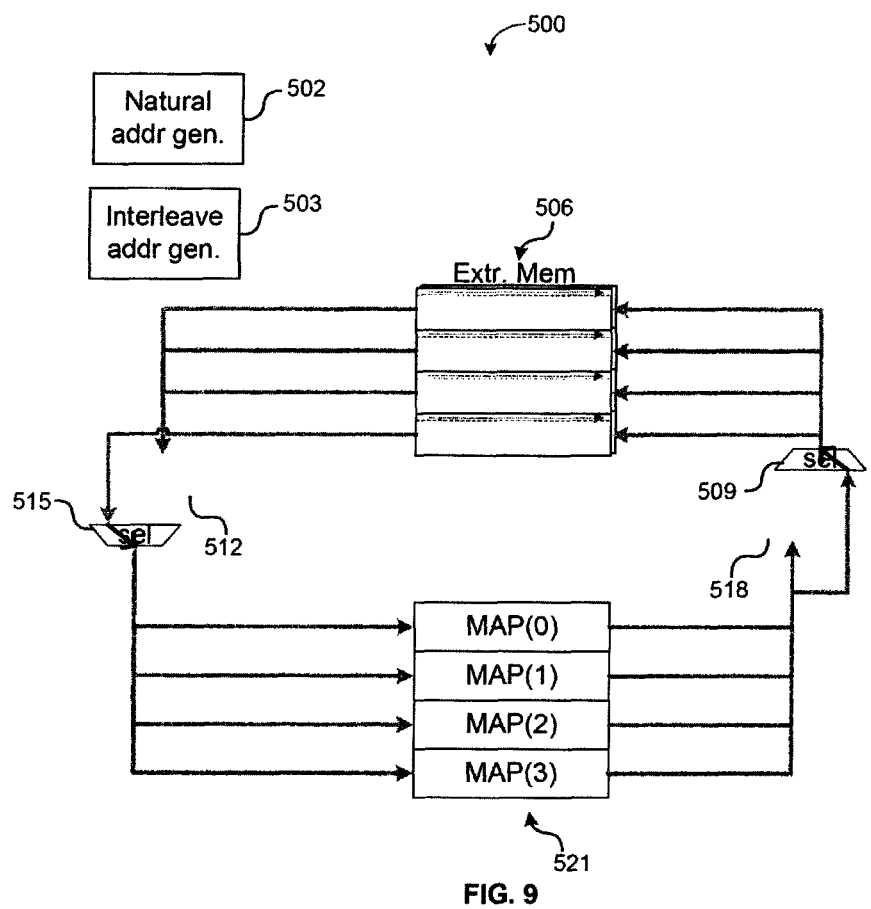
FIG. 9 is a diagram illustrating an example extrinsic data flow during an even half-iteration operation for a turbo decoder according to one embodiment of the present invention.

FIG. 9 illustrates extrinsic data flow 500 during the even half-iteration operation of the illustrated turbo decoder. As illustrated, because MAP engine bank 521 accesses extrinsic memory banks 506 in natural row and column order, read column buffer 512 and write column buffer 509 have been bypassed by read selector 515 and write selector 509 respectively. During the even half-iteration, the location of each extrinsic bit within extrinsic memory banks 506 is determined by natural memory address generator 502, which generates memory addresses according to natural row and column order.

Figure 10:
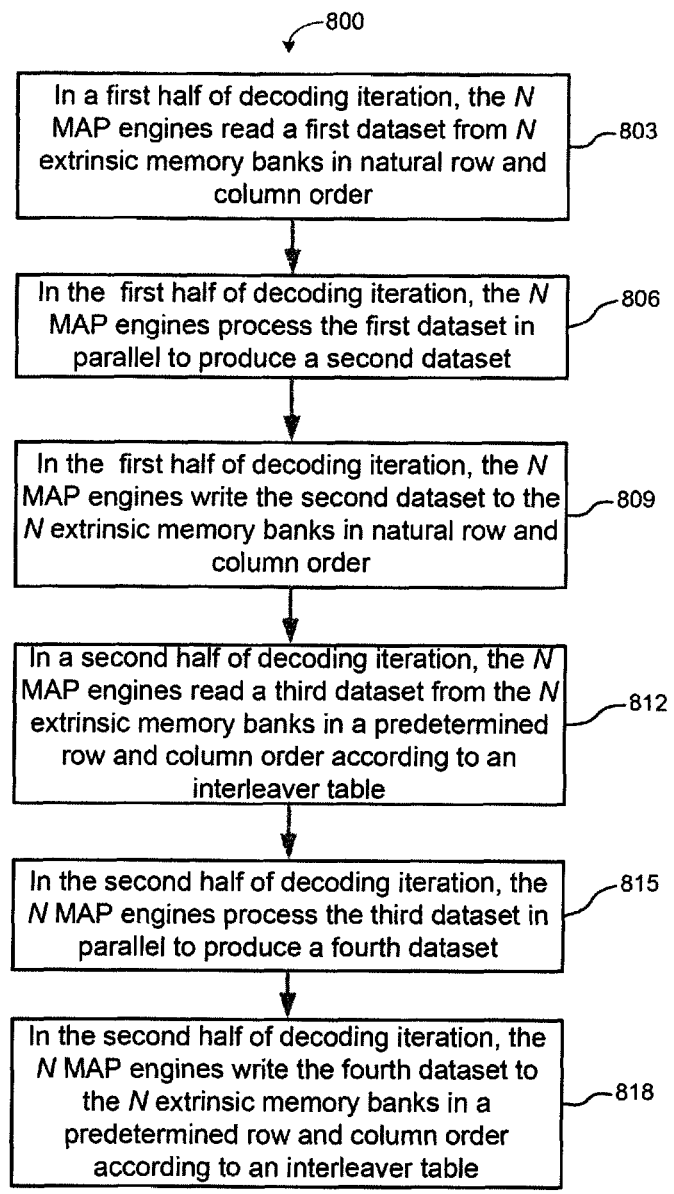
FIG. 10 is a flowchart illustrating an example method according to one embodiment of the present invention for avoiding extrinsic memory contention in a turbo decoder.

FIG. 10 is a flowchart illustrating an example method 800 according to one embodiment of the present invention for avoiding extrinsic memory contention in a turbo decoder. Beginning at operation 803, in a first half of a decoding iteration (e.g., even half-iteration), the N MAP engines read a first dataset from the N extrinsic memory banks in natural row and column order. For example, as illustrated in FIGS. 5 and 9, the first dataset is the extrinsic bits ($e_i$) read in parallel and in natural row and column order by MAP engine bank 521 from extrinsic memory banks 506.

Using the first dataset, in operation 806, the N MAP engines process the first dataset in parallel and produce a second dataset, which is written back to the extrinsic memory banks in natural row and column order. This also illustrated in FIGS. 5 and 9, where the second dataset is the extrinsic bits written in parallel and in natural row and column order by MAP engine bank 521 to extrinsic memory banks 506. In some embodiments, where systematic information and extrinsic information are combined to avoid input memory contention during the even half-iteration, the second dataset would contain $v'_i = s_i + e'_i$, as illustrated in FIG. 5. Additionally, the memory location to which the second dataset is written to in extrinsic memory banks 506 may be the same location as the memory location from which the first dataset read from in extrinsic memory banks 506.

Once the second half of the decoding iteration e.g., odd half-iteration) is entered, the N MAP engines read a third dataset from the N extrinsic memory banks in a predetermined row and column order in accordance with an interleaver table (e.g., interleaver table of a 3GPP WCDMA/HSPA standard). According to some embodiments, the N MAP engines read the third dataset from the N extrinsic memory banks by using a read column buffer in accordance with the embodiments illustrated FIGS. 5, 7 and 8, where extrinsic bits (i.e., third dataset) are first successively preloaded from the extrinsic memory banks to the read column buffer on behalf of each MAP engine within the MAP engine bank (one column per a MAP engine), and then each MAP reads the extrinsic bits from a designated column of the read column buffer.

Subsequently, in operation 815, the N MAP engines process the third dataset in parallel and produce a fourth dataset, which is written back to the extrinsic memory banks in the aforementioned predetermined row and column order. According to some embodiments, the N MAP engines write the fourth dataset to the N extrinsic memory banks by using a write column buffer in accordance with the embodiments illustrated FIGS. 5, 7 and 8, where each MAP engine within the MAP engine bank outputs extrinsic bits (i.e., fourth dataset) to a designated column of the write column buffer in parallel (one column per a MAP engine), after which the extrinsic bits in each column of the write column buffer are written (i.e. off-loaded) to the N extrinsic memory banks.

Figure 11:
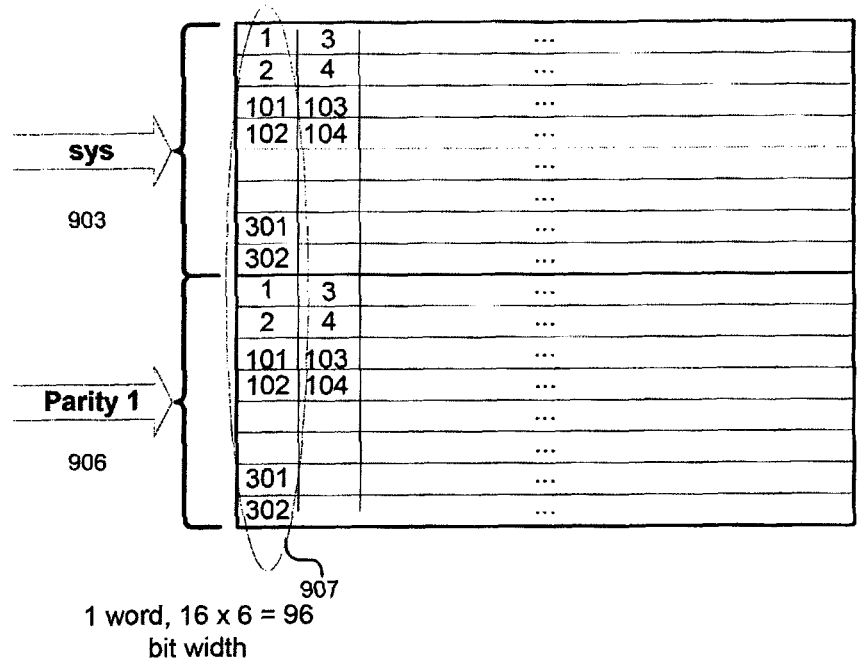
FIG. 11 is a diagram illustrating an example of packing input memory according to one embodiment of the present invention.
Figure 12:
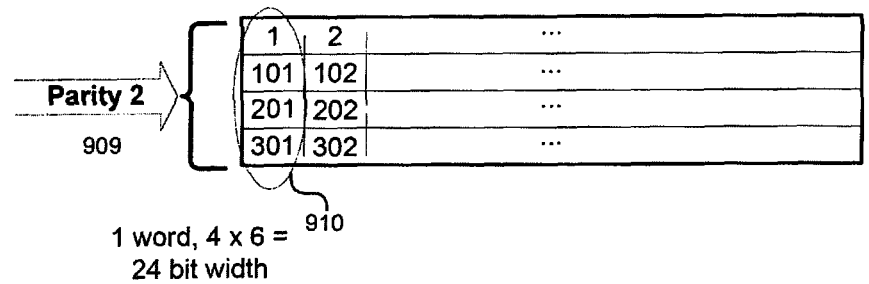
FIG. 12 is a diagram illustrating an example of packing input memory according to one embodiment of the present invention.

With respect to input memory, for some embodiments, information bits systematic, parity-1, and parity-2 bits) are packed into one wide memory cell (word) such that N MAP engines can access the input bits linearly without the need for a separate information memory bank for each MAP engine. For example, where an embodiment processes 8 bits-wide systematic information and comprises four radix-4 MAP engines, rather than have four 16 bits-wide systematic memory banks for each radix-4 MAP engine (since radix-4 MAP engines can accept two 8 bits-wide inputs per a MAP cycle), the embodiment could utilize a single 64 bits-wide systematic memory cell for all four radix-4 MAP engines. The 64 bits-wide systematic memory cell contains the 16 bit systematic information for each of the radix-4 MAP engines and the systematic information can be read linearly by each radix-4 MAP engine. FIG. 11 is a diagram illustrating an example of packing systematic bits 903 and parity-1 bits 906 into one memory cell parity-1 memory cell 907 in accordance with one embodiment of the present invention. FIG. 12 is a diagram illustrating an example of parity-2 bits 909 into a parity-2 memory cell 910 in accordance with one embodiment of the present invention.

Turning now to FIG. 11, for systematic bits 903 and parity-1 bits 906, bits 1/2/101/102/201/202/301/302 from systematic bits 903 and bits 1/2/101/102/201/202/301/302 from parity-1 bits 906 are packed into a single memory cell 907 96 bits-wide, where bits 1/2 are meant for the first radix-4 MAP engine, where bits 101/102 are meant for the second radix-4 MAP engine, where bits 201/202 are meant for the third radix-4 MAP engine, and where bits 301/302 are meant for the fourth radix-4 MAP engine. FIG. 11 assumes a length of 400 systematic bits and 400 parity bits, assumes each radix-4 MAP engine processes an equal amount of information bits, and assumes that the information bits are 6 bits-wide. Depending on the embodiment, the systematic bits 903 and the parity-1 bits 906 may be packed into more than one memory cell (e.g., two memory cells).

Turning now to FIG. 12, for parity-2 bits 909, bits 1/101/201/301 from parity-2 bits 909 are packed into a single parity-2 memory cell 910 24 bits-wide, where bit 1 is meant for the first radix-4 MAP engine, where bit 101 is meant for the second radix-4 MAP engine, where bit 201 is meant for the third radix-4 MAP engine, and where bit 301 is meant for the fourth radix-4 MAP engine. It should be noted that during the odd half-iteration, when the parity-2 bits are being accessed by radix-4 MAP engines functioning as radix-2 MAP engines, only one input bit (i.e., 6 bits) is needed for each radix-4 MAP engine; this is unlike the even half-iteration, when two input bits [i.e., 12 bits] are needed for each radix-4 MAP that is operating normally. It should also be noted that in some embodiments, when dummy bits are detected and removed from the systematic input of the MAP engines during the odd half-iteration, the size of the parity-2 memory cell 910 must be adjusted accordingly to account for the dummy bit removals. In some embodiments, to speed up the packing of parity-2 bits 909, both even and odd bits can be packed into one cell (word).

The following provides pseudo code on how to implement various features in some embodiments of the invention. For the pseudo code listed herein, it is assumed that in even half-iterations, the MAP engines read from and write to extrinsic memory in interleaved/de-interleaved order, and that in the odd half-iteration, the MAP engines read from and write to extrinsic memory in natural order.

In some embodiments, to compute the number of information bits (e.g., systematic, parity-1, parity-2 bits) for each MAP, the following pseudo code may be utilized. Specifically, for packing data into systematic and parity-1 memory, CSSe(i) is computed, and for packing data into parity-2 memory, CSSo(i) is computed.

CSSe(i) (i=0 to nMAP-1) can be computed as follows:
Input: nMAP, R, C
Output: nRow(i), CSSe(i)
Pseudo Code:
    lr=0; // temporary variable, located rows
    for i=0 to nMAP-1
    {
        // compute un-located rows
        ur=R-lr;
        // compute nRow(i)
        nRow(i)=floor(ur/(nMAP-i));
        // update lr
        lr=lr+nRow(i);
    };
    for i=0 to nMAP-1
    {
        CSSe(i)=nRow(i)*C;
    }
    CSSe(nMAP-1)=CSSe(nMAP-1)(R*C-K); // adjustment the last CSSe because of dummy bits CSSo(i)=0 to nMAP-1) is computed by computing nCol(i). Although the computation of CSSo(i) is dynamic as data is packed into parity-2 memory, nCol(i) must be pre-computed in order to compute CSSo(i).
Input: nMAP, C
Output: nCol(i)
Pseudo Code:
    lc=0; // temporary variable, the located columns
    for i=0 to nMAP-1
        // compute un-located columns
        uc=C-lc:
        // compute nCol(i)
        nCol(i)=floor(uc/(nMAP-i));
        //update lc
        lc=lc+nCol(i);
    end;

Next, the following Matlab© code can be used to compute nCol(i) and CSSo(i) and pack parity-2 bits. Although nMap (number of MAP engines) is set to 4 in this particular embodiment, alternative embodiments may be set to any number, such as 2, 4, or 8. In the following example code, the interleaved address is used in even half-iterations.
Main Program:

```
nMAP = 4;
%compute columns for each MAP
nCol = zeros(1,nMAP);
for ii = 0:nMAP-1
    % located Columns
```

```
        lc = sum(nCol);
        % unlocated Columns
        uc = C - lc;
        nCol(ii+1) = floor(uc/(nMAP-ii));
    end;
    % accumulate nCol for nCol_ind
    nCol_ind(1)=nCol(1); % matlab index
    for t = 2:length(nCol)
        nCol_ind(t)=nCol_ind(t-1) + nCol(t);
    end;
    input = 1:K;
    memory = zeros(nMAP,max(nCol)*R);
    %get total dummy bits
    nDummy = R*C-K;
    %continue if no uncomplete dummy line
    nDummyBitsLastRow = mod(nDummy,C);
    %get total rows with dummy bits
    nDummyRows = ceil(nDummy/C);
    %get the row number of uncomplete dummybits
    nIndDummy = R-nDummy Rows;
    iCol = 0;
    iRow = 0;
    rmwAdd = 0;
    iMap = 0;
    CSSo_ind(1) = 0;
    if nDummyRows == 0 %no dummy
        seed = 0;
    else
        seed = mod(r(R-nDummyRows+1) * iCol, p-1);
    end;
    iBit = 0;
    while iBit < K
        % determinate if next bit is dummy
        isDummy = testDummy(iRow,iCol,seed,p,nIndDummy,
nDummyBitsLastRow, C,
s, T);
        % if next bit is dummy
        if (isDummy==1)
            %write to memroy
            memory(iMap+1,rmwAdd+2)=input(iBit+1);
            % jump to next bit
            iRow = iRow + 2;
            rmwAdd = rmwAdd + 2;
            % don't have to test if cross the boundary !!!
        else    % else: next bit is not dummy
            %write to memroy
            memory(iMap+1,rmwAdd+1)=input(iBit+1);
            iRow = iRow + 1;
            rmwAdd = rmwAdd + 1;
            if iRow == R
                iRow = 0;
                iCol = iCol + 1;
                if iCol==nCol_ind(iMap+1)
                    rmwAdd = 0;
                    iMap = iMap + 1;
                    CSSo_ind(iMap+1)=iBit+1;
                end;
                % update seed
                if nDummyRows ~= 0 %no dummy
                    seed = seed +r(R-nDummyRows+1);
                    while seed >= p-1
                        seed = seed - (p-1);
                    end;
                end;
            end;
        end;
        iBit = iBit + 1;
    end;
    for ii= 1:nMAP
        CSSo(ii)=CSSo_ind(ii+1)-CSSo_ind(ii);
    end;
subroutine testdummy( ):
function isDummy = testdummy(iRow, iCol, seed, p, nIndDummy,
nDummyBitsLastRow, C ,s, T)
    isDummy = 0;
    tmp = T(iRow+1);
    % decide if it is dummy bit
    if tmp > nIndDummy % row all bits are dummy
        isDummy = 1;
    elseif tmp == nIndDummy % row that some of bits are dummy
        if(nDummyBitsLastRow==0)
            isDummy = 1;
        else
            if(C == p-1)
                cAdd = s(seed+1)-1:
            elseif (C==p)
                if (iCol == p-1)
                    cAdd = 0;
                else
                    cAdd = s(seed+1);
                end;
            else % (C == p+1)
                if (iCol == p-1)
                    cAdd = 0;
                elseif (iCol == p)
                    cAdd =p;
                else
                    cAdd = s(seed+1);
                end;
            end;
            if (cAdd >= C-nDummyBitsLastRow)
                isDummy = 1;
            end;
        end;
    end;
end; % end iRow
return;
```

According to some embodiments, the interleaving performed when the turbo decoder is in HSPA mode is in accordance with the following 3GPP specification. The following notations are useful in understanding how the 3GPP specification:

K Number of bits input to Turbo code internal interleaver

R Number of rows of rectangular matrix

C Number of columns of rectangular matrix p Prime number v Primitive root $\langle s(j) \rangle_{j \in \{0, 1, \ldots, p-2\}}$ Base sequence for intra-row permutation $q_i$ Minimum prime integers $r_i$ Permuted prime integers $\langle T(i) \rangle_{i \in \{0, 1, \ldots, R-1\}}$ Inter-row permutation pattern $\langle U_i(j) \rangle_{j \in \{0, 1, \ldots, C-1\}}$ Intra-row permutation pattern of i-th row i Index of row number of rectangular matrix j Index of column number of rectangular matrix k Index of bit sequence The $s^{-1}(j)$ sequence is the inversed permutation sequence of sequence $s(j)$ (i.e, $s^{-1}$) and used to perform the reversed permutation of intra-row interleave:

$$s^{-1}(s(j))=j \; j=0, \ldots, p-2 \qquad \text{Equation 1}$$

The $r^{-1}(i)$ sequence is defined such that each element is the reciprocal of the corresponding element of r sequence in terms of modulus of p-1:

$$r_i^{-1} * r_i \equiv 1 \pmod{p-1} \; i=0, \ldots R-1 \qquad \text{Equation 2}$$

The $U_i^{-1}(j)$ sequence is defined as intra-row reversed permutation pattern of i-th row, i.e.:

$$U_i^{-1}(U_i(j))=j, \qquad \text{Equation 3}$$

The computation of $s^{-1}(j)$ sequence may be performed offline. The 3GPP describes this computation of s as:

$$s(j)=(v*s(j-1)) \bmod p \; j=1,2,\ldots,(p-2), \text{ and } s(0)=1 \qquad \text{Equation 4}$$

According to this definition, $s^{-1}(j)$ is constructed as:
$s^{-1}(1)=0$
$s(0)=1$
for j=1 to p−2
  compute s(j)
  $s^{-1}(s(j))=j$;
end for The computation of $r^{-1}(i)$ sequence may be performed offline as well. The 3GPP describes this computation of r as:

$$r_{T(i)}=q_i, i=0,1,\ldots,R-1, \quad \text{Equation 5}$$

In order to simplify the computation of $r^{-1}(i)$ sequence, in some embodiments, $q^{-1}(i)$ for i=1,..., R−1 is first computed, since $q^{-1}(0)$ is always 1 and doesn't need computation. Then sequence $r^{-1}(i)$ is obtained as:

$$r^{-1}{}_{T(i)}=q^{-1}{}_i, i=0, 1, \ldots, R-1, \quad \text{Equation 6}$$

In order to compute $q^{-1}$ sequence, extended Euclidean algorithm may be used. The following is a modified algorithm for each $q^{-1}(i)$:

```
a = p − 1;
b = q[i];
c = 0;
d = 1;
while(b!=1){
  if (a>b){
    a = a−b;
    c = c−d;
  } else {
    b = b−a;
    d = d−c;
  }
}
q⁻¹[i]=d;
```

In view of above, in some embodiments that utilize the 3GPP specification for de-interleaving, the de-interleave address may be calculated as follows:

$$U_i^{-1}(U_i(j))=j, \quad \text{Equation 7}$$

if (C==p). According to 3GPP, $U_i(j)$ is computed as $$U_i(j)=s((j*r_i)\mod(p-1)), j=0, 1, \ldots,(p-2) \text{ and } U_i(p-1)=0, \quad \text{Equation 8}$$

then $$s^{-1}(U_i(j))=s^{-1}s((j*r_i)\mod(p-1))$$

$$s^{-1}(U_i(j))=(j*r_i)\mod(p-1)$$

$$s^{-1}(U_i(j))*r_i^{-1})\mod(p-1)=(j*r_i*r_i^{-1})\mod(p-1)$$

$$s^{-1}(U_i(j))*r_i^{-1})\mod(p-1)=j \quad \text{Equation 9}$$

Comparing Equation C with equation A, we get $$U_i^{-1}(j)=(s^{-1}(U_i(j)*r_i^{-1})\mod(p-1) \quad \text{Equation 10}$$

Similarly, $U_i^{-1}(j)$ sequence can be obtained when (C=p+1) or (C=p−1). $U_i^{-1}(j)$ is computed on the fly while $s^{-1}$ And $r^{-1}$ are pre-computed. From the equation above, to generate a intra-row de-interleave address, it takes one operation of memory read (i.e. $s^{-1}(.)$), one multiplication operation (i.e. $s^{-1}(.)*r_i^{-1}$) and one division operation (i.e. mod(p−1)).

In some embodiments, the following pseudo code may be used in HSPA mode to compute de-interleaved intra-row address:

```
Variables:
  cInd_, Column index, range from 0 to C−1
  rInd_, Row index, range from 0 to R−1
  s_1(j), the inversed permutation sequence of sequence s(j), j from 0 to p−2
  r_1(j), the sequence of r⁻¹, which is the reciprocal of r in terms of modulus of p−1, j from 0 to R−1
Output:
  cAdd, the intra-row de-interleave address
Pseudo code:
1. In case of C == p
    If cInd_ == 0
      cAdd = p−1;
    else
      cAdd = (s_1[cInd_−1])*r_1[rInd_]%(p−1);
    end if
2. In case of C == p + 1
    if cInd_ == 0
      cAdd = p−1;
    else if cInd_== p
      cAdd1 = p;
    else
      cAdd = (s_1[cInd_−1])*r_1[rInd_]%(p−1);
    end if
    if (K == R*C) && (rInd_+RU_ == R−1)   // special case
      if cAdd==0
        cAdd=p;
      else if cAdd==p
        cAdd=0;
      end if
    end if // end of special case
3. In case of C == p−1
    cAdd = (s_1 [cInd_])*r_1[rInd_]%(p−1);
```

In alternative embodiments, in order to generate a de-interleave address for even half-iterations, the multiplication and a division operations typically needed per cycle per MAP engine can be avoided by first generating a row of intra-row interleave addresses, and then building an intra-row de-interleave address based on the interleave address. In such embodiments, the building of an intra-row de-interleave addresses based on the interleave addresses needs only addition and subtraction operations only. Some such embodiments utilize two 256-word buffers per MAP engine.

According to some embodiments that utilize the 3GPP specification for interleaving, the inter-row interleave address is given by the 3GPP specification as the pattern $\langle T(i) \rangle_{i \in \{0, 1, \ldots, R-1\}}$, (where T(i) is the original row position of the i-th permuted row.

According to some embodiments, the interleaving performed when the turbo decoder is in LTE mode is in accordance with a quadratic polynomial permutation (QPP) interleaver. In LTE mode, the data stored in the plurality of extrinsic memory banks are in natural order.

In even half iterations, a counter which produces monotonic number increases is used as an interleave memory address generator during normal order iterations. A counter which produces monotonic number decreases is used as an interleave memory address generator during reverse order iterations. After the data is read from extrinsic memory, both the data and interleave read address are sent to a MAP. After the certain delay due to MAP operations, the output is written into extrinsic memory banks according to the read address.

In odd half iterations, the data read from the extrinsic memory banks is in interleaved order. Same as the operation in even half iterations, after the data is read from extrinsic memory, both the data and interleave read address are sent to a MAP. After the certain delay due to MAP operations, the output is written into extrinsic memory banks according to the read address.

In LTE, the equation of interleave address is:

$$\Pi(n) = (f_1 * n + f_2 * n^2) \mod K \quad \text{Equation 11}$$

The n is interleave output bit index, $\Pi(n)$ is input bit index and $f_1$ and $f_2$ are given in 3GPP TS 36212, "Multiplexing and channel coding," Release 8, V8.7.0, 2009-05.

The memory is divided into multiple banks for multiply MAP engines to process in parallel, the output bit index n can be represented by a output bit index and a memory offset:

$$n = K/nMAP * j + i \quad \text{Equation 12}$$

The following equations are used in computing the input bit index and input memory offset:

$$\prod(i, j) = (f_1 * (K/nMAP * j + i) + f_2 * (K/nMAP * j + i)^2) \mod(K/nMAP)$$

$$= (f_1 * i + f_2 * i^2) \mod(K/nMAP)$$

$$= \prod(i) \quad \text{Equation 13}$$

$$\Phi(j,i) = \text{floor}((f_1 * (K/nMAP * j + i) + f_2 * (K/nMAP * j + i)^2) \mod(K)/(K/nMAP)) \quad \text{Equation 14}$$

According to Equation 13, the interleave addresses for output bits with the same bit index have the same bit index as well.

While in HSPA mode, some embodiments mark dummy bits in extrinsic memory banks as data is loaded into input memory, such is not necessary in LTE mode. The size of code segments are all equal for all MAPs:

$$CSSe(i) = CSSo(i) = K/nMAP, \text{ where } i=0 \text{ to } nMap-1 \quad \text{Equation 15}$$

In LTE, CSS0(i) equals CSSe(i), where CSSe(i) is the size of code segment for i-th MAP in even half iterations without dummy bits, and CSSo(i) the size of code segment for i-th MAP in odd half iterations without dummy bits.

In some embodiments, the following pseudo code may be used in LTE mode to compute interleave address generation during normal order iterations:

```
Input: K, nMAP, f1, f2
Output:              bit_ind, mem_ind[0:nMAP-1] for all output bit index i
                     base1_r, base2_r, base0_r [0:nMAP-1] for computation for reverse order iterations
Intermediate Variables:  base1, base2, base0[0:nMAP-1]
Pseudo code:
                     // initial
                     For j = 0 to nMAP-1
                         Base0[j] = mod(f1*j+f2*K/nMAP*j*j, nMAP);
                     End for
                     base1 = 0;
                     base2 = mod(f1 + f2, K);
                     // compute address (bit index and memory index for each i)
                     For i = 0 to K/nMAP-1
                         // save initialization value for computation for reverse order
                         If i = K/nMAP-1
                             base0_r[0:nMAP-1] = base0[0:nMAP-1] ;
                             base1_r = base1;
                         end if
                         If i = K/nMAP-2
                             base2_r = K-base2;
                         end if
                         // compute bit index
                         bit_ind =mod(base1, K/nMAP);
                         //compute memory index
                         mem_ind[0: nMAP-1]=mod(base0[0: nMAP -1] +
                         floor(base1/(K/nMAP)), nMAP);
                         // update variables
                         base0 =mod(base0+2*f2*[0:nMAP-1], nMAP);
                         base1 =mod(base1+base2,K);
                         base2 =mod(base2+2*f2,K);
                     End for
```

In some embodiments, the following pseudo code may be used in LTE mode to compute interleave address generation during reverse order iterations. The initial values are obtained during interleave address generation under normal order iterations:

```
Input: K, nMAP, f1, f2
            base1_r, base2_r, base0_r[0:nMAP-1] from normal order
            iterations
Output:     bit_ind, mem_ind[0:nMAP-1] for all output bit index i
            Intermediate Variables:   base1, base2, base0[0:nMAP-1]
Pseudo code:
            // initial
            base0[0:nMAP-1] = base0_r[0:nMAP-1];
            base1 = base1_r;
            base2=base2_r;
            // compute address (bit index and memory index for each i)
            For i = K/nMAP −1 to 0
              // compute bit index
              bit_ind =mod(base1 , K/nMAP);
              //compute memory index
              mem_ind[0: nMAP-1]=mod(base0[0: nMAP −1] +
              floor(base1/(K/nMAP)), nMAP);
              // update variables
              base0 =mod(base0+2*f2*[0:nMAP-1], nMAP);
              base1 =mod(base1+base2,K);
              base2 =mod(base2+2*f2,K);
            End for
```

As used herein, the term set may refer to any collection of elements, whether finite or infinite. The term subset may refer to any collection of elements, wherein the elements are taken from a parent set; a subset may be the entire parent set. The term proper subset refers to a subset containing fewer elements than the parent set. The term sequence may refer to an ordered set or subset. The terms less than, less than or equal to, greater than, and greater than or equal to, may be used herein to describe the relations between various objects or members of ordered sets or sequences; these terms will be understood to refer to any appropriate ordering relation applicable to the objects being ordered.

Figure 13:
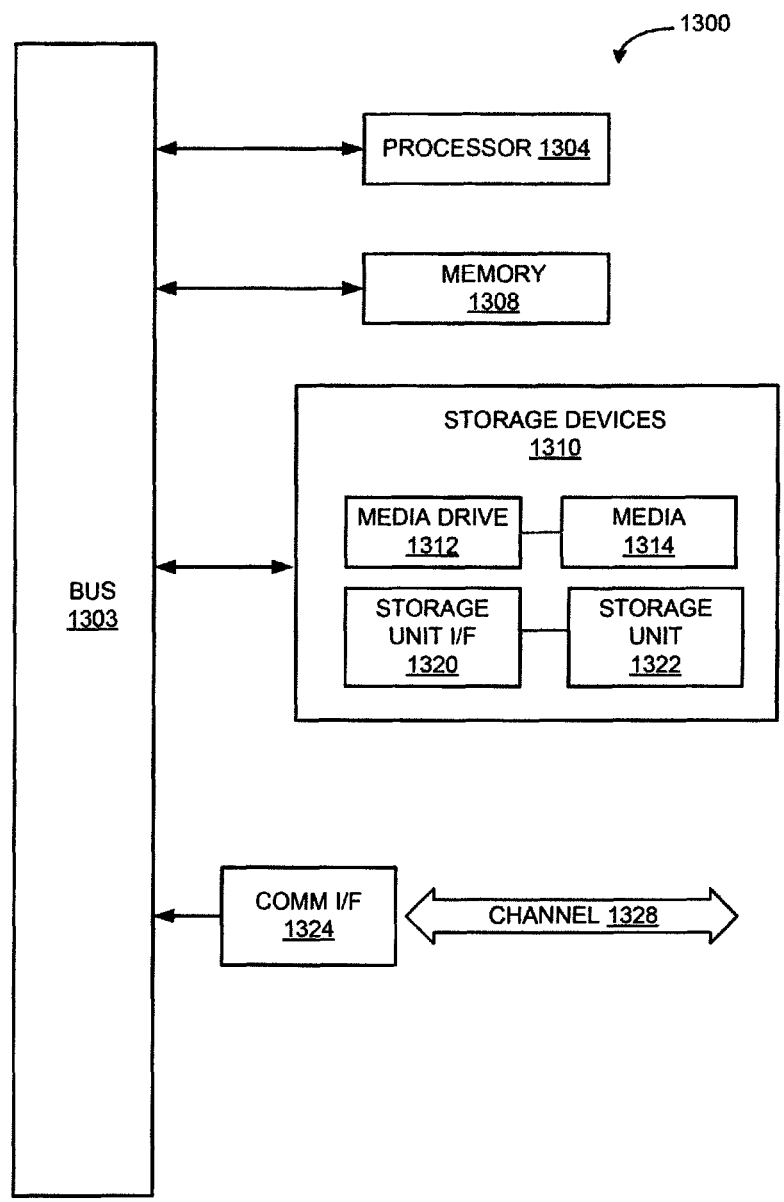
FIG. 13 is a diagram illustrating an example computing module with which aspects of the systems and methods described herein can be implemented in accordance with one embodiment of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example computing module is shown in FIG. 13. Various embodiments are described in of this example-computing module 1300. After reading this description, it will become apparent to a person skilled in the relevant art how to implement the invention using other computing modules or architectures.

Referring now to FIG. 13, computing module 1300 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 1300 might also represent computing capabilities embedded within or otherwise available to a given device. For example, a computing module might be found in other electronic devices such as, for example, digital cameras, navigation systems, cellular telephones, portable computing devices, modems routers, WAPs, terminals and other electronic devices that might include some form of processing capability.

Computing module 1300 might include, for example, one or more processors, controllers, control modules, or other processing devices, such as a processor 1304. Processor 1304 might be implemented using a general-purpose or special-purpose processing engine such as, for example, a microprocessor, controller, or other control logic. In the illustrated example, processor 1304 is connected to a bus 1302, although any communication medium can be used to facilitate interaction with other components of computing module 1300 or to communicate externally.

Computing module 1300 might also include one or more memory modules, simply referred to herein as main memory 1308. For example, preferably random access memory (RAM) or other dynamic memory, might be used for storing information and instructions to be executed by processor 1304. Main memory 1308 might also be used for storing temporary variables or other intermediate information during execution of instructions to be executed by processor 1304. Computing module 1300 might likewise include a read only memory ("ROM") or other static storage device coupled to bus 1302 for storing static information and instructions for processor 1304.

The computing module 1300 might also include one or more various forms of information storage mechanism 1310, which might include, for example, a media drive 1312 and a storage unit interface 1320. The media drive 1312 might include a drive or other mechanism to support fixed or removable storage media 1314. For example, a hard disk drive, a floppy disk drive, a magnetic tape drive, an optical disk drive, a CD or DVD drive (R or RW), or other removable or fixed media drive might be provided. Accordingly, storage media 1314 might include, for example, a hard disk, a floppy disk, magnetic tape, cartridge, optical disk, a CD or DVD, or other fixed or removable medium that is read by, written to or accessed by media drive 1312. As these examples illustrate, the storage media 1314 can include a computer usable storage medium having stored therein computer software or data.

In alternative embodiments, information storage mechanism 1310 might include other similar instrumentalities for allowing computer programs or other instructions or data to be loaded into computing module 1300. Such instrumentalities might include, for example, a fixed or removable storage unit 1322 and an interface 1320. Examples of such storage units 132 and interfaces 1320 can include a program cartridge and cartridge interface, a removable memory (for example, a flash memory or other removable memory module) and memory slot, a PCMCIA slot and card, and other fixed or removable storage units 1322 and interfaces 1320 that allow software and data to be transferred from the storage unit 1322 to computing module 1300.

Computing module 1300 might also include a communications interface 1324. Communications interface 1324 might be used to allow software and data to be transferred between computing module 1300 and external devices. Examples of communications interface 1324 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 1324 might typically be carried on signals, which can be electronic, electromagnetic (which includes optical) or other signals capable of being exchanged by a given communications interface 1324. These signals might be provided to communications interface 1324 via a channel 1328. This channel 1328 might carry signals and might be implemented using a wired or wireless communication medium. Some examples of a channel might include a phone line, a cellular link, an RF link, an optical link, a network interface a local or wide area network, and other wired or wireless communications channels.

In this document, the terms "computer program medium" and "computer usable medium" are used to generally refer to media such as, for example, memory 1308, storage unit 1320, media 1314, and channel 1328. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1300 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order n which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" "an" should be read as meaning "at least one," "one or more" or like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A turbo decoder comprising:
a plurality of maximum a posteriori (MAP) engines;
a plurality of extrinsic memory banks accessible by a MAP engine of the plurality of MAP engines; and
wherein the plurality of extrinsic memory banks is configured such that during a first half of a decoding iteration, the MAP engine is able to read a first dataset from and write second dataset to the plurality of extrinsic memory banks in natural row and column order, and during a second half of the decoding iteration, the MAP engine is able to read a third dataset from and write a fourth dataset to the plurality of extrinsic memory banks in a predetermined row and column order in accordance with an interleaver table.

2. The turbo decoder of claim 1, further comprising an interleaver address generator that provides the predetermined row and column order as a plurality of memory addresses for the extrinsic memory banks.

3. The turbo decoder of claim 1, further comprising a read column buffer, wherein during the second half of the decoding iteration, the third dataset is read from plurality of extrinsic memory banks in the predetermined row and column order and written to the read column buffer in natural order, and the MAP engines reads the fourth dataset from the read column buffer in first-in-first-out order.

4. The turbo decoder of claim 3, wherein the plurality of MAP engines comprises N MAP engines, and wherein each of the N MAP engines concurrently reads a subset of the third dataset from the read column buffer in parallel.

5. The turbo decoder of claim 3, wherein the plurality of MAP engines comprises N MAP engines, wherein the plurality of extrinsic memory banks comprises R rows, and wherein the read column buffer size is at least R×N.

6. The turbo decoder of claim 3, wherein the plurality of MAP engines comprises N MAP engines, wherein the plurality of extrinsic memory banks comprises N memory banks, wherein collectively the N memory banks are divided into R rows such that each of the N memory banks contains R/N rows, wherein each column j of the read column buffer is associated with a corresponding jth MAP engine of the N MAP engines, and wherein reading the third dataset from plurality of extrinsic memory banks in the predetermined row and column order and writing the third dataset to the read column buffer in natural order comprises:
for k=1, 2, 3, 4 ... N and m=1, 2, 3, 4 ... R/N, for each kth column of the read column buffer, reading a subset of the third dataset in parallel from a mth row of each of the N memory banks and writing the subset into a kth column of the read column buffer, wherein the subset is read from the mth row of each of the N memory banks according to the predetermined row and column order.

7. The turbo decoder of claim 6, wherein for k=1, 2, 3, 4 ... N, concurrently each kth MAP engine of the N MAP engines reads a subset of the third dataset in parallel from a corresponding kth column of the read column buffer.

8. The turbo decoder of claim 1, further comprising a write column buffer, wherein during the second half of the decoding iteration, the MAP engines write the fourth dataset to the write column buffer in natural order, and the fourth dataset in the write column buffer is written to the plurality of extrinsic memory banks in the predetermined row and column.

9. The turbo decoder of claim 8, wherein the plurality of MAP engines comprises N MAP engines, and wherein each of the N MAP engines concurrently writes a subset of the fourth dataset to the write column buffer in parallel.

10. The turbo decoder of claim 8, wherein the plurality of MAP engines comprises N MAP engines, wherein the plurality of extrinsic memory banks comprises R rows, and wherein the write column buffer size is at least R×N.

11. The turbo decoder of claim 8, wherein the plurality of MAP engines comprises N MAP engines, wherein the plurality of extrinsic memory banks comprises N memory banks, wherein collectively the N memory banks are divided into R rows such that each of the N memory banks contains R/N rows, wherein each column j of the write column buffer is associated with a corresponding jth MAP engine of the N MAP engines, and wherein writing the fourth dataset to the write column buffer in natural order and writing the fourth dataset to the plurality of extrinsic memory banks in predetermined row and column order comprises:
for k=1, 2, 3, 4 ... N and m=1, 2, 3, 4 ... R/N, for each kth column of the write column buffer, reading a subset of the fourth dataset from a kth column of the write column buffer and writing the subset in parallel to a mth row of each of the N memory banks, wherein the subset is written to the mth row of each of the N memory banks according to the predetermined row and column order.

12. The turbo decoder of claim 11, wherein for k=1, 2, 3, 4 ... N, concurrently each kth MAP engine of the N MAP engines writes a subset of the fourth dataset in parallel to a corresponding kth column of the write column buffer.

13. The turbo decoder of claim 1, wherein the plurality of MAP engines comprises N MAP engines, wherein the plurality of extrinsic memory banks comprises N memory banks, wherein collectively the N memory banks are divided into R rows such that each of the N memory banks contains R/N rows, and wherein during the first half of the decoding iteration, for k=1, 2, 3, 4 ... N, concurrently each kth MAP engine of the N MAP engines reads a subset of the first dataset in natural order from rows 1, 2, 3, 4 ... R/N of a corresponding kth extrinsic memory bank of the N extrinsic memory banks.

14. The turbo decoder of claim 1, wherein the plurality of MAP engines comprises N MAP engines, wherein the plurality of extrinsic memory banks comprises N memory banks, wherein collectively the N memory banks are divided into R rows such that each of the N memory banks contains R/N rows, and wherein during the first half of the decoding iteration, for k=1, 2, 3, 4 ... N, concurrently each kth MAP engine of the N MAP engines writes a subset of the second dataset in natural order to rows 1, 2, 3, 4 ... R/N of a corresponding kth extrinsic memory bank of the N extrinsic memory banks.

15. The turbo decoder of claim 1, wherein the interleaver table is formatted in accordance with a 3rd Generation Partnership Project (3GPP) standard.

16. The turbo decoder of claim 1, wherein the plurality of extrinsic memory banks comprises N memory banks, wherein collectively the N memory banks are divided into R rows such that each of the N memory banks contains R/N rows, and wherein R is a maximum of 20.

17. The turbo decoder of claim 1, wherein the plurality of extrinsic memory banks comprises dual-port memory banks.

18. The turbo decoder of claim 1, wherein the plurality of MAP engines comprises a radix-2 MAP engine or radix-4 MAP engine.

19. The turbo decoder of claim 1, the turbo decoder further comprising:
a systematic memory bank;
a parity memory bank; and
wherein the turbo decoder is configured such that during decoding:
in the first half of the decoding iteration, the MAP engine:
(i) receives as input systematic bits $s_i$ from a systematic memory bank of the systematic memory banks, a priori data $e_i$ from the first plurality of extrinsic memory banks, and parity-1 bits $p_i$ from a first parity memory bank of the plurality of parity memory banks,
(ii) generates $v'_i = s_i + e'_i$, and
(iii) stores $v'_i$ in the second plurality of extrinsic memory banks, where $e'_i$ is the a priori information generated by the MAP engine during the first half of the decoding iteration, and in the second half of the decoding iteration, the MAP engine:
(iv) receives as input interleaved data $v_j$ from the second plurality of extrinsic memory banks, and parity-2 bits $p_j$ from a second parity memory bank of the plurality of parity memory banks,
(v) generates extrinsic data $e'_j$, and
(vi) stores $e'_j$ in the first plurality of extrinsic memory banks.

20. A method of decoding using a turbo decoder comprising N MAP engines and N extrinsic memory banks accessible by each of the N MAP engines, wherein the N extrinsic memory banks, the method comprising:

in a first half of a decoding iteration, the N MAP engines read a first dataset from the N extrinsic memory banks in natural row and column order;

in the first half of a decoding iteration, the N MAP engines write a second dataset to the N extrinsic memory banks in natural row and column order;

in a second half of a decoding iteration, the N map engines read a third dataset to the N extrinsic memory banks in a predetermined row and column order in accordance with an interleaver table; and in the second half of a decoding iteration, the N map engines write a fourth dataset to the N extrinsic memory banks in the predetermined row and column order.

21. The method of claim 20, wherein the interleaver table is formatted in accordance with a 3rd Generation Partnership Project (3GPP) standard.

22. The method of claim 20, wherein the N extrinsic memory banks collectively comprises R rows such that each of the N memory banks contains R/N rows, and wherein the N MAP engines reading the first dataset from the N extrinsic memory banks comprises: for k=1, 2, 3, 4 . . . N, each kth MAP engine of the N MAP engines reading the first dataset in natural order from rows 1, 2, 3, 4 . . . R/N of a kth extrinsic memory bank of the N extrinsic memory banks.

23. The method of claim 20, wherein the N extrinsic memory banks collectively comprises R rows such that each of the N memory banks contains R/N rows, and wherein the N MAP engines writing the second dataset to the N extrinsic memory banks comprises: for k=1, 2, 3, 4 . . . N, each kth MAP engine of the N MAP engines writing the second dataset in natural order to rows 1, 2, 3, 4 . . . R/N of a kth extrinsic memory bank of the N extrinsic memory banks.

24. The method of claim 20, wherein the N extrinsic memory banks collectively comprises R rows such that each of the N memory banks contains R/N rows, wherein each column j of a read column buffer is associated with a corresponding jth MAP engine of the N MAP engines, and wherein the N map engines reading the third dataset to the N extrinsic memory banks comprises:

for k=1, 2, 3, 4 . . . N and m=1, 2, 3, 4 . . . R/N, for each kth column of the read column buffer, reading a subset of the third dataset in parallel from a mth row of each of the N memory banks and writing the subset into a kth column of the read column buffer, wherein the subset is read from the mth row of each of the N memory banks according to the predetermined row and column order.

25. The method of claim 24, and wherein the N map engines reading the third dataset from the N extrinsic memory banks further comprises: for k=1, 2, 3, 4 . . . N, concurrently each kth MAP engine of the N MAP engines reading a subset of the third dataset in parallel from a corresponding kth column of the read column buffer.

26. The method of claim 20, wherein the N extrinsic memory banks collectively comprises R rows such that each of the N memory banks contains R/N rows, wherein each column j of a write column buffer is associated with a corresponding jth MAP engine of the N MAP engines, and wherein the N map engines writing the fourth dataset to the N extrinsic memory banks comprises:

for k=1, 2, 3, 4 . . . N and m=1, 2, 3, 4 . . . R/N, for each kth column of the write column buffer, reading a subset of the fourth dataset from a kth column of the write column buffer and writing the subset in parallel to a mth row of each of the N memory banks, wherein the subset is written to the mth row of each of the N memory banks according to the predetermined row and column order.

27. The method of claim 26, and wherein the N map engines writing the fourth dataset to the N extrinsic memory banks further comprises:

for k=1, 2, 3, 4 . . . N, concurrently each kth MAP engine of the N MAP engines writing the fourth dataset in parallel to the corresponding kth column of the write column buffer.

28. A turbo decoder comprising:

a plurality of maximum a posteriori (MAP) engines; a plurality of extrinsic memory banks accessible by a MAP engine of the plurality of MAP engines;

wherein the turbo decoder is configured to operate in a High-Speed Packet Access (HSPA) mode and a Long Term Evolution (LTE) mode;

wherein when the turbo decoder is operating in HSPA mode the plurality of extrinsic memory banks is configured such that during a first half of a decoding iteration, the MAP engine is able to read a first dataset from and write second dataset to the plurality of extrinsic memory banks in natural row and column order, and during a second half of the decoding iteration, the MAP engine is able to read a third dataset from and write a fourth dataset to the plurality of extrinsic memory banks in a predetermined row and column order in accordance with an HSPA interleaver table; and wherein when the turbo decoder is operating in LTE mode the plurality of extrinsic memory banks is configured to be accessed according to a quadratic polynomial permutation (QPP) interleaver table.

29. A turbo decoder comprising:

a plurality of maximum a posteriori (MAP) engines;

a plurality of extrinsic memory banks accessible by a MAP engine of the plurality of MAP engines; and wherein the plurality of extrinsic memory banks is configured such that during a first half of a decoding iteration, the MAP engine is able to read a firstdataset from and write second dataset to the plurality of extrinsic memory banks in intra-row order and natural column order, and during a second half of the decoding iteration, the MAP engine is able to read a third dataset from and write a fourth dataset to the plurality of extrinsic memory banks in a natural row and a predetermined column order in accordance with an interleaver table.

* * * * *